United States Patent [19]
Suzuki et al.

[11] Patent Number: 5,606,737
[45] Date of Patent: Feb. 25, 1997

[54] OSCILLATOR MIXER AND A MULTIPLIER MIXER FOR OUTPUTTING A BASEBAND SIGNAL BASED UPON AN INPUT AND OUTPUT SIGNAL

[75] Inventors: Hiroshi Suzuki; Hiroyuki Sogou; Kenichi Kudo, all of Kawasaki; Yoshihiro Miura; Kiyokazu Sugai, both of Sendai; Masayoshi Shono, Kobe; Hideki Shiratori, Sendai, all of Japan

[73] Assignees: Fujitsu Limited, Kawasaki; Fujitsu Ten Limited, Kobe, both of Japan

[21] Appl. No.: 28,552

[22] Filed: Mar. 8, 1993

[30] Foreign Application Priority Data

| Mar. 9, 1992 | [JP] | Japan | 4-050812 |
| Mar. 12, 1992 | [JP] | Japan | 4-053770 |
| Mar. 16, 1992 | [JP] | Japan | 4-057946 |
| Mar. 16, 1992 | [JP] | Japan | 4-058133 |

[51] Int. Cl.$^6$ .................................................. H04B 1/26
[52] U.S. Cl. .................. 455/319; 455/325; 455/333; 455/264; 332/136; 342/21; 342/70
[58] Field of Search ............................ 342/111, 109, 342/112, 116, 117, 129, 130, 98, 100, 21, 70, 128; 455/319, 318, 316, 325, 326, 327, 328, 182.2, 184.1, 192.2, 196.1, 207, 208, 209, 255, 257, 262, 333, 264; 332/135, 136; 329/323, 324

[56] References Cited

U.S. PATENT DOCUMENTS

| 3,922,609 | 11/1975 | Grohmann | 455/192.2 X |
| 4,709,406 | 11/1987 | Omoto | 455/182.2 X |
| 4,991,226 | 2/1991 | Bongiorno | 455/316 X |

*Primary Examiner*—Reinhard J. Eisenzopf
*Assistant Examiner*—Philip J. Sobutka
*Attorney, Agent, or Firm*—Nikaido, Marmelstein, Murray & Oram LLP

[57] ABSTRACT

In a structure adopted for an FM-CW radar, a corner waveguide for connecting each of transmission and reception antennas to a sensor unit is integrated with a sensor unit case. In a waveguide/strip line converter for converting the transmission mode between the waveguide and the strip lines in the circuits of the sensor unit, a ditch is dug in the inner wall of an opening of the waveguide in order to prevent oozing of conductive adhesive. The strip line board is abutted on the inner wall of the waveguide in order to restrict a length of a projecting portion of a line conductor on the strip line board. By employing an oscillator mixer or a multiplier mixer, the circuitry in the sensor unit can be simplified without using lots of expensive millimeter wave devices. Furthermore, power can be utilized effectively even when a switching radar is off, which enables measurement of an absolute speed. Moreover, cost reduction can be achieved.

12 Claims, 30 Drawing Sheets

OSCILLATOR MIXER AND A MULTIPLIER MIXER FOR OUTPUTTING A BASEBAND SIGNAL BASED UPON AN INPUT AND OUTPUT SIGNAL

BACKGROUND OF THE INVENTION

1. Field of the Invention

The present invention relates to a corner waveguide-integrated electric circuit case, a waveguide/strip line converter, a circuit serving both as an oscillator and a mixer (hereafter referred to as an oscillator mixer), a circuit serving both as a multiplier and a mixer (a multiplier mixer), and an arrangement of a frequency-modulated continuous-wave (hereafter, FM-CW) radar. In particular, this invention is concerned with a corner waveguide-integrated electric circuit case and a waveguide/strip line converter, which are preferred as structures for connecting between antennas and a sensor unit in an FM-CW radar, an oscillator mixer and a multiplier mixer, which are preferred as circuits for a sensor unit in an FM-CW radar, and a new arrangement of an FM-CW radar.

2. Description of the Related Art

An FM-CW radar transmits an electric wave that is frequency-modulated by a triangular wave to an object via a transmission antenna, receives an electric wave reflected from the object via a reception antenna, generates a beat signal by mixing the received wave with the transmission wave in a mixer, and then analyzes the frequency of the beat signal in order to measure a relative distance and a relative velocity with respect to the object simultaneously. The FM-CW radar is mounted on the outer surface of an automobile, helicopter, or other vehicle because of its purpose of use. The FM-CW radar is, therefore, requested to be compact in terms of appearance and ease of installation. A millimeter wave band is usually used as the output frequency. Therefore, if a large number of circuit components is required, many expensive millimeter wave devices are employed, and an increase in cost ensues.

In an on-vehicle FM-CW radar, both a transmission antenna and a reception antenna are composed of a waveguide in which holes through which electromagnetic waves leak out or invade are bored at specified intervals, and a parabolic reflector lying behind the waveguide. The transmission and reception waveguides are stood up in a V-shaped form so that wave fronts from the waveguides cross. A sensor unit containing the circuits of a transmitter and a receiver is placed below the antennas. The whole radar section including the transmission and reception antennas and the sensor unit is shaped like a letter Y.

The radar is mounted on a front grille. The size, or especially, height of the radar must be as small as possible in terms of limited installation space and appearance.

As an attempt to cope with this demand, a bent waveguide or a corner waveguide is used. Specifically, a waveguide linked with the sensor unit is positioned horizontally in order to reduce the height of a radar.

This structure requires a bent waveguide or a corner waveguide, which poses the first problem that the number of parts increases and the height can be reduced only on a limited basis.

As described previously, each of the transmission and reception antennas is connected to a sensor unit via a hollow waveguide. The circuitry in the sensor unit is constituted by a microstrip lines made up of a dielectric board, a grounded conductor formed on the bottom of the dielectric board, and strip lines formed on the top of the dielectric board. At a junction between the transmission or reception antenna and the sensor unit, therefore, a waveguide/strip line converter must be provided to convert the transmission mode between the hollow waveguide and the strip line.

The waveguide/strip line converter usually has such a structure that a strip line board, which is realized with a dielectric board having a grounded conductor on part of its back and strip lines on its surface, projects into a hollow determined by the inner wall of a hollow waveguide from a side opening in a stationary fashion. The strip line board is secured by attaching the entire grounded conductor to the inner wall of the side opening of the hollow using conductive adhesive or solder.

When an equipment in which the waveguide/strip line converter having the aforementioned structure is incorporated is manufactured according to a mass production system, some products may be provided with excessive conductive adhesive or solder which will ooze out duly. In addition, although a strip line board must be fixed at a precise position, the above structure may cause a variation in the length of a projecting portion among products.

The shape of the line pattern in the projecting portion of a waveguide/strip line converter is designed to provide a maximum conversion characteristic (VSWR) for a product that has no oozing of conductive adhesive and is aligned precisely. If conductive adhesive oozes out or a fixing position deviates, the VSWR (voltage standing wave ratio) deteriorates. This results in the second problem that a desired conversion characteristic is unavailable.

In a basic configuration of an FM-CW radar, a sensor unit consists of a voltage-controlled oscillator, a directional coupler, and a mixer. The voltage-controlled oscillator inputs a modulating signal of a triangular wave, and outputs a millimeter wave signal that is frequency-modulated by a triangular wave. The millimeter wave signal is transmitted to a transmission antenna. Part of the millimeter wave signal is branched by the directional coupler, and mixed with a received millimeter wave signal coming from a reception antenna by the mixer. A baseband signal whose frequency corresponds to a difference in frequency between the transmitted wave and received wave is then fetched. A device used for a millimeter wave oscillator is, generally, expensive. Alternatively, the voltage-controlled oscillator generates a frequency-modulated signal whose frequency is a divisor of the transmission frequency, and then a multiplier multiplies the frequency-modulated signal.

The voltage-controlled oscillator, mixer, and multiplier have been constructed independently using different active elements. This poses the third problem that a sensor unit must be realized as a large circuitry made up of numerous expensive millimeter wave devices.

When two systems of FM-CW radars each having the aforesaid configuration are mounted on a vehicle, one of the FM-CW radars uses transmission and reception antennas, which are installed on the front frame of the vehicle, to measure a relative distance and a relative speed with respect to a vehicle running ahead, while the other FM-CW radar uses a transmission antenna placed to face the oblique forward ground and a reception antenna which is installed so as to receive part of electric waves reflected irregularly from the ground, to perform almost the same processing as one FM-CW radar. This permits measurement of a speed of a vehicle as well as a relative speed. If the speed of a vehicle can be measured, an absolute speed of a vehicle running ahead can be calculated and displayed, and, in conjunction with a measured value of a rotating speed of a wheel, a slip occurring on a tire can be detected and the degree of the slip can be measured. Thus, the range of use of an FM-CW radar further expands.

An FM-CW radar having the aforesaid configuration has a characteristic that the output signal of a voltage-controlled oscillator is changed not only in frequency but also in amplitude relative to a variation in amplitude of a control signal. Therefore, an amplitude-modulated (hereafter, AM) component whose frequency is the same as the frequency of a modulating signal (FM-AM conversion noise) is superimposed on the output signal. This frequency is very close to the frequency of a signal resulting from FM detection of a reflected signal. As a result, the signal-to-noise ratio deteriorates. A switching radar has been proposed as a solution to the above problem.

The switching radar comprises a rectangular wave generator that generates a rectangular wave whose frequency is sufficiently lower than the frequency of a carrier and at least twice as large as a frequency corresponding to a sum or difference between beat frequencies generated by a mixer, and a switch that is driven with the rectangular wave and outputs a frequency-modulated wave as a signal whose amplitude is modulated with an on/off signal. When the rectangular wave signal is mixed with an output of the mixer, the FM-AM conversion noise occurring in the voltage-controlled oscillator is eliminated effectively. Consequently, a signal with a high signal-to-noise ratio results.

As described previously, two systems of electric circuits are needed to enable measurement of a speed of a vehicle. This contradicts a demand for downsizing and price cutting. As for the switching radar, it does not effectively utilize power when switched off.

SUMMARY OF THE INVENTION

An object of the present invention is to provide a corner waveguide-integrated electric circuit case permitting further downsizing and price cutting of an FM-CW radar.

Another object of the present invention is to provide a waveguide/strip line converter that makes it possible to reduce influence of the oozing of conducting adhesive (solder) resulting in deteriorated characteristics and is preferable for an FM-CW radar.

Another object of the present invention is to provide a waveguide/strip line converter that makes it easy to align a stripline board with a waveguide and is preferable for an FM-CW radar.

Another object of the present invention is to provide an oscillator mixer and a multiplier mixer each of which is realized by a millimeter wave device having two or more functions and contributes to materialization of a compact and low-price FM-CW radar.

Another object of the present invention is to provide a compact and low-price radar capable of measuring not only a relative distance and a relative speed with respect to an object but also an absolute self-speed.

Another object of the present invention is to provide a radar capable of effectively eliminating FM-AM conversion noise and utilizing power in a switching radar placed in the off state.

In accordance with the present invention, there is provided a corner waveguide-integrated electric circuit case, comprising:

a first conductor member including a first outer surface having a board mounting section on which an electric circuit board is mounted, a second outer surface opposed to the first outer surface, and an inner surface determining a first elongated space that penetrates from the first outer surface to the second outer surface;

a second conductor member including a third outer surface that is in close contact with the second outer surface of the first conductor member, the third outer surface having a linear groove that determines a second elongated space extending from one end of the first elongated space in the direction crossing the first elongated space together with the corresponding portion of the second outer surface; and a third conductor member attached to the first conductor member so as to shield the electric circuit board mounted on the board mounting section of the first outer surface;

the inner surface, the linear groove, and the corresponding portion of the second outer surface making up an inner wall of a corner waveguide that is coupled with electric circuits formed on the electric circuit board.

In accordance with the present invention, there is also provided a waveguide/strip line converter, comprising:

a hollow waveguide having a side opening;

a strip line board including a dielectric board, a grounded conductor formed on one surface of the dielectric board, and a line conductor formed on the other surface of the dielectric board, the grounded conductor being fixed to an inner wall of the side opening so that an end of the line conductor projects into the hollow of the hollow waveguide; and an anti-oozing means for eliminating influence of an excessively oozing portion of conductive adhesive that attaches and electrically connects the grounded conductor to the inner wall of the side opening.

In accordance with the present invention, there is also provided a waveguide/strip line converter, comprising:

a hollow waveguide having a side opening;

a strip line board including a dielectric board, a grounded conductor formed on one surface of the dielectric board, and a line conductor formed on the other surface of the dielectric board, the grounded conductor being fixed to an inner wall of the side opening so that an end of the line conductor projects into the hollow of the hollow waveguide; and projection length restricting means for restricting a length of a projecting portion of the line conductor into the hollow of the hollow waveguide.

In accordance with the present invention, there is also provided an oscillator mixer for providing an output signal having a specified frequency modulated in accordance with a modulating signal and for outputting a baseband signal having a frequency corresponding to a difference in frequency between an input signal and the output signal, comprising:

a voltage-controlled oscillator including an element having a non-linear characteristic, and providing an output signal having the specified frequency which varies in accordance with the voltage of the modulating signal;

a coupling member inserted into the voltage-controlled oscillator so as to couple the input signal with a line on which the output signal resides; and a baseband signal output port connected to the voltage-controlled oscillator via a member for blocking a signal having the specified frequency and through which the baseband signal is fetched.

In accordance with the present invention, there is also provided a multiplier mixer for providing an output signal obtained by multiplying a first input signal, and for outputting a baseband signal whose frequency corresponds to a difference in frequency between a second input signal and the output signal, comprising:

a multiplier including an element having a non-linear characteristic, inputting the first input signal, and outputting a multiplied signal as the output signal;

a coupling member inserted in the multiplier so as to couple the second input signal with a line on which the output signal resides; and a baseband signal output port connected to the multiplier via a member for blocking a signal having the same frequency as the output signal and through which the baseband signal is fetched.

In accordance with the present invention, there is provided a radar, comprising:

a modulating circuit for generating a frequency modulated transmission wave;

a first transmission antenna for transmitting the transmission wave generated by the modulating circuit toward a first object in a first direction;

a second transmission antenna for transmitting the transmission wave generated by the modulating circuit toward a second object in a second direction different from the first direction;

a switching circuit for supplying the transmission wave generated by the modulating circuit selectively to the first transmission antenna or the second transmission antenna;

a first reception antenna for receiving a wave reflected from the first object;

a second reception antenna for receiving a wave reflected from the second object;

a demodulating circuit for generating a demodulated signal by demodulating a wave received with the first and second reception antenna; and a signal processing circuit for calculating a relative distance and a relative speed with respect to the first object, and a relative speed with respect to the second object, from the demodulation signal.

DESCRIPTION OF THE PREFERRED EMBODIMENTS

Figure 1A:
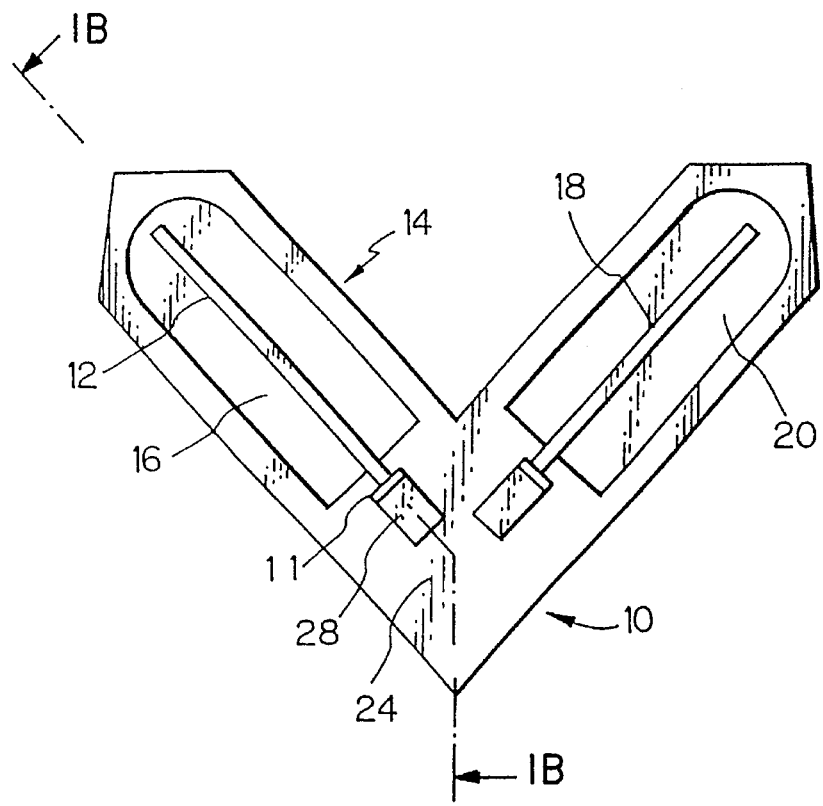
FIG. 1A is a front view of a radar section of an FM-CW radar according to an embodiment of the present invention.
Figure 1B:
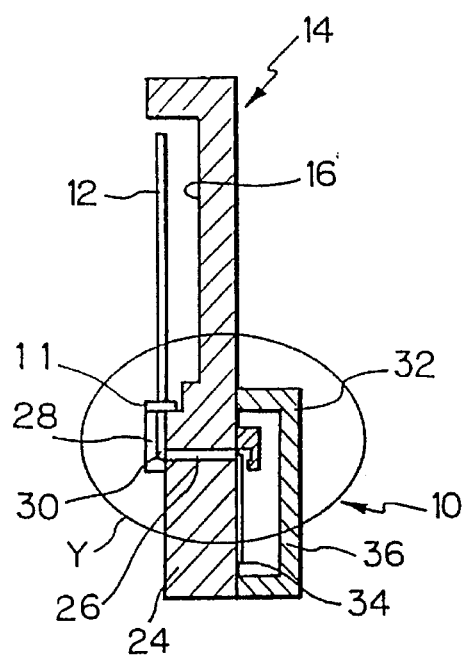
FIG. 1B is a cross-sectional view of the radar section of the FM-CW radar.
Figure 2:
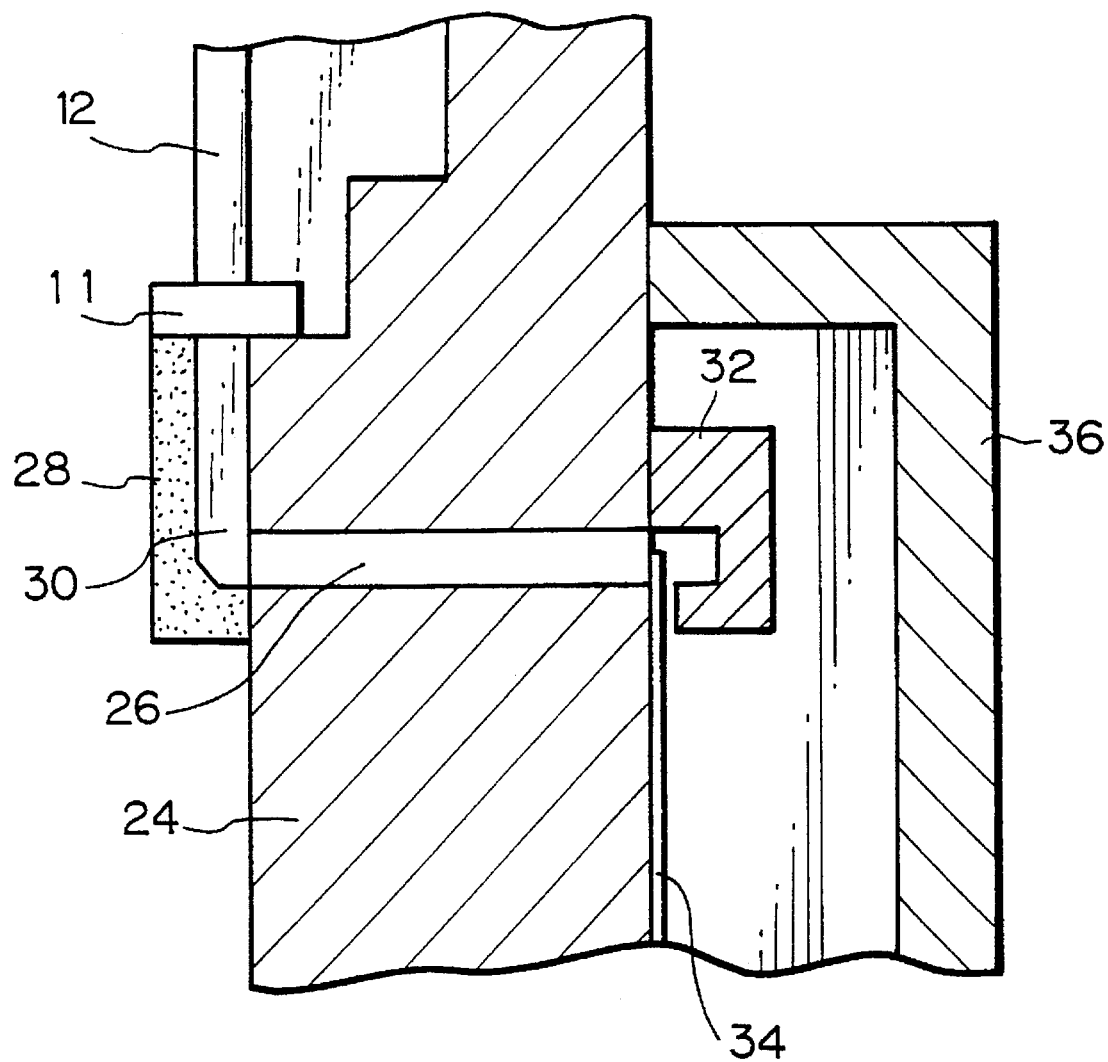
FIG. 2 is an enlarged cross-sectional view of the radar section of the FM-CW radar.

FIGS. 1A and 1B show a radar section of an on-vehicle FM-CW radar according to an embodiment of the present invention. FIG. 1A is a front view, while FIG. 1B is an X-X cross-sectional diagram. FIG. 2 is an enlarged view of a portion indicated with Y in FIG. 1B. Referring to FIGS. 1A and 1B, and 2, a construction of the first embodiment of the present invention will be described.

A sensor unit 10 contains electric circuits: such as, a transmitter that transmits an fm modulating wave, and a receiver that receives a wave reflected from an object, detects the wave by performing homodyne reception, and sends a baseband signal to a signal processor which is not shown. A waveguide 12, in which holes for leaking out electromagnetic waves are bored at regular intervals, and a parabolic reflector 16 provided on the surface of a radar housing 14 make up a parabolic reflector antenna using the waveguide 12 as a linear wave source. A reception parabolic reflector antenna is composed of a waveguide 18 and a parabolic reflector 20.

A metallic member 24 has a through hole 26 that fits the cross section of the waveguide 12. A corner waveguide is made up of the through hole 26 and a linear groove 30 that is dug in a metallic member 28 and fits the cross actin of the waveguide 12. The waveguide 12 is connected to the corner waveguide via a flange 11. The other end of the corner waveguide is terminated with a metallic member 32. Part of a circuit board 34 mounted on the metallic member 24 is projecting into the terminal portion of the corner waveguide. The terminal portion forms a waveguide/strip line converter in cooperation with a strip line on the circuit board 34. The striplines on the circuit board 34 provide electric circuits such as a modulator and a demodulator. A metallic member 36 protects and shields the electric circuits entirely. In short, the corner waveguide is integrated with a metallic case made up of the metallic members 24, 28 and 36.

The metallic member 24 extends upward. The parabolic reflector 16 is formed on the surface of the metallic member 24. That is to say, the radar housing 14 and the case of the sensor unit 10 are integrated. This structure realizes downsizing and price cutting.

Figure 3A:
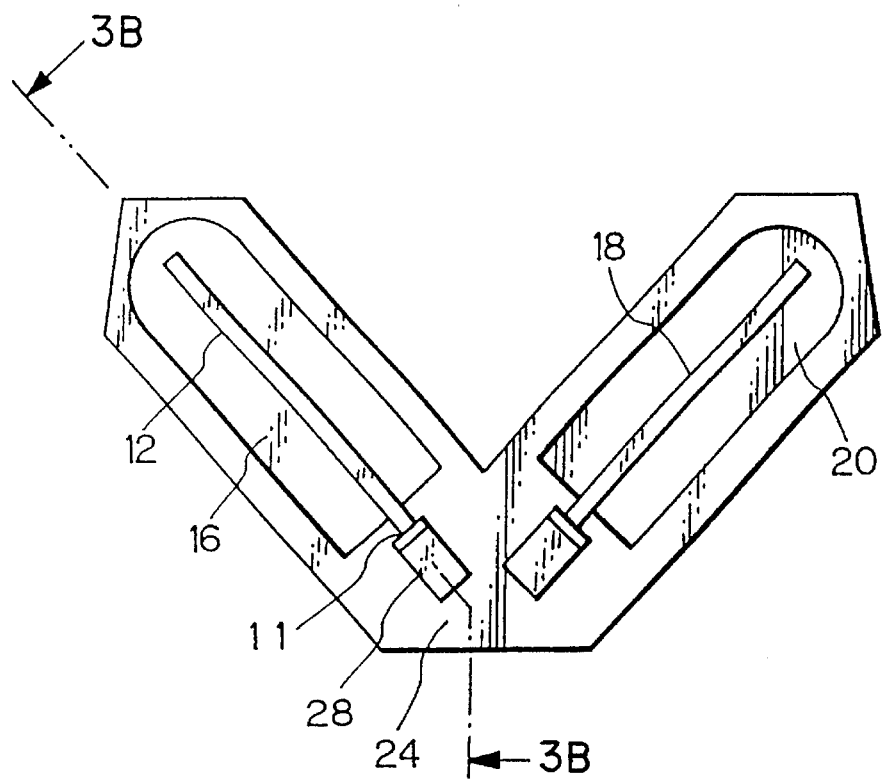
FIG. 3A is a front view of a radar section of an FM-CW radar according to another embodiment of the present invention.
Figure 3B:
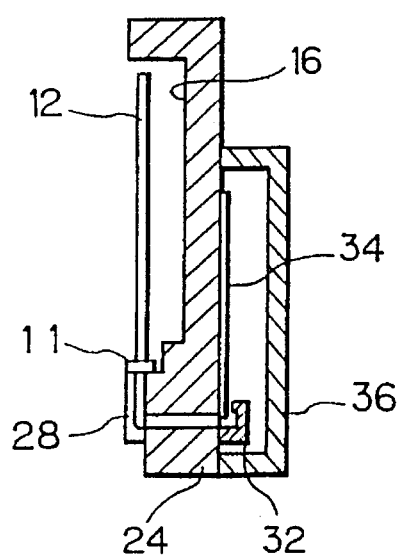
FIG. 3B is a cross-sectional view of the radar section of the FM-CW radar.

FIGS. 3A and 3B show another embodiment of the present invention. In this embodiment, the circuit board 34 is mounted on the back of the parabolic reflector 16. This structure realizes further downsizing. The reflector 16 also plays a role of a heat sinking plate for the circuit board 34.

This structure of the present invention is not limited to an FM-CW radar, but, needless to say, can apply to a general device that requires a bent waveguide or a corner waveguide, and a case containing electric circuits connected to the waveguide.

Figure 4A:
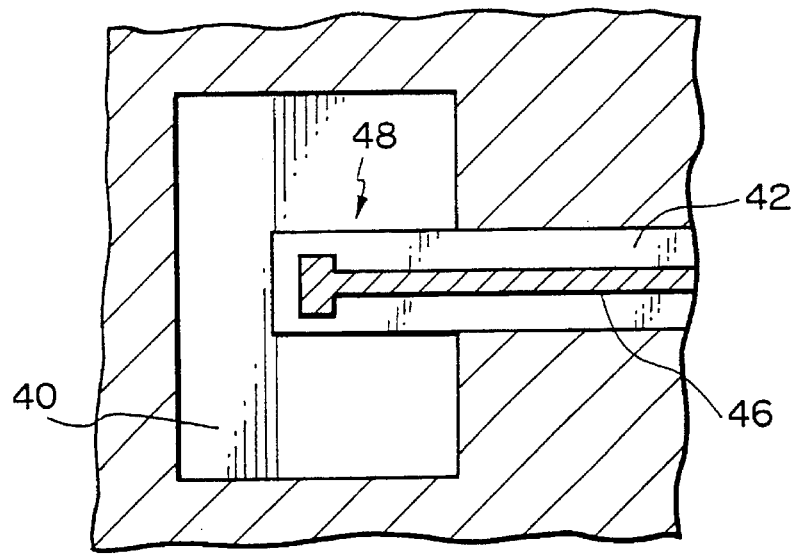
FIG. 4A is a transverse sectional view of a conventional waveguide/strip line converter.
Figure 4B:
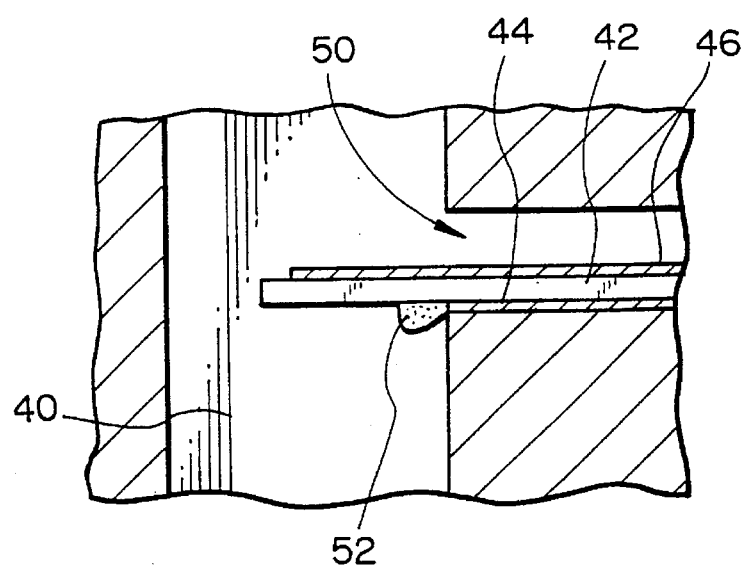
FIG. 4B is a longitudinal sectional view of the conventional waveguide/strip line converter.

In FIG. 1B or 3B, the waveguide/strip line converter is formed at the terminal portion of the waveguide formed with the through hole 26 bored on the metallic member 24. FIGS. 4A and 4B show a structure of a conventional waveguide/strip line converter. FIG. 4A is a cross-sectional diagram, viewing the structure along the axis of a waveguide. FIG. 4B is a cross-sectional diagram, viewing the structure from the side of the waveguide. As illustrated, the waveguide/strip line converter usually has a structure that a strip line board 48 realized with a dielectric board 42 having a grounded conductor 44 on part of the back thereof and a strip line 46 on the surface thereof is projecting from a side opening into a hollow 40 determined by the inner wall of a hollow waveguide in a stationary fashion. The strip line board 48 is secured by attaching the entire grounded conductor 44 to the inner wall of the side opening 50 of the hollow 40 using conductive adhesive or solder.

When an equipment in which a waveguide/strip line converter having the above structure is incorporated is manufactured according to a mass production system, some products may be provided with excessive conductive adhesive or solder. The excessive conductive adhesive or solder then may ooze out (52) as shown in FIG. 4B. In addition, although the strip line board 48 must be fixed at a precise position, the above structure may cause a variation in length of the projecting section among products.

Figure 5:
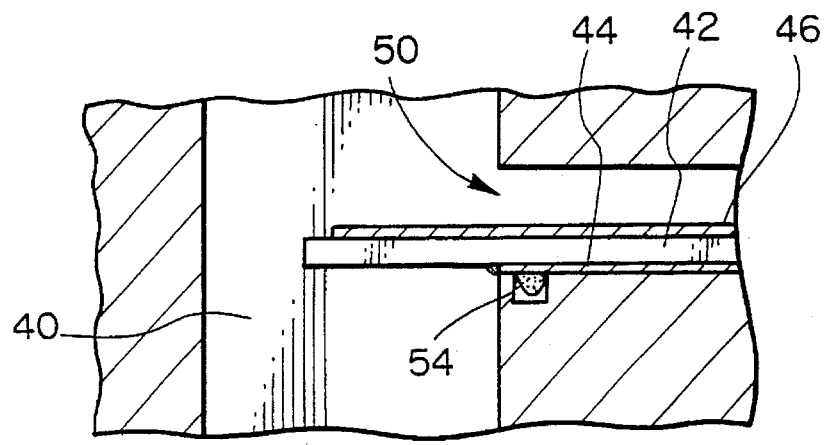
FIG. 5 is a longitudinal sectional view of a waveguide/strip line converter according to another embodiment of the present invention.

FIG. 5 is a cross-sectional diagram showing another embodiment of the present invention, which corresponds to FIG. 4B. In this embodiment, a groove 54 is dug in the inner wall of the opening 50 in the vicinity of the hollow 40. A majority of excessive conductive adhesive (solder) oozes out to the groove 54. A quantity of conductive adhesive oozing out to the hollow 40 is reduced. Therefore, even if excessive conductive adhesive (solder) is used, the conversion characteristic does not deteriorate very much.

Figure 6:
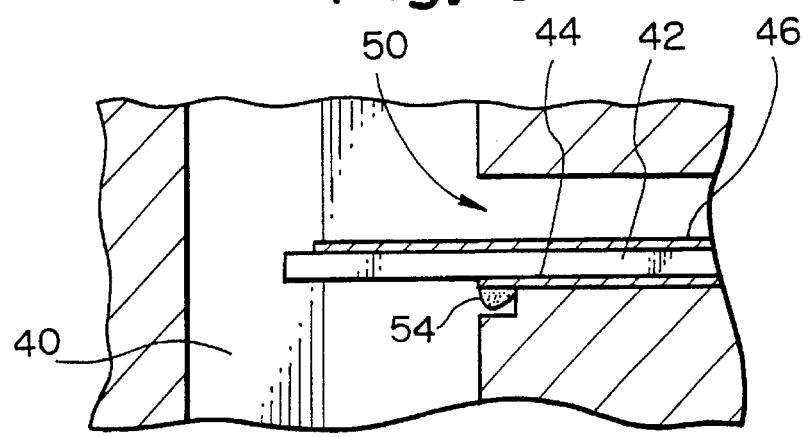
FIG. 6 is a longitudinal sectional view of a waveguide/strip line converter according to another embodiment of the present invention.

FIG. 6 shows another embodiment of the present invention. The groove 54 joins the hollow 40. In FIG. 6, even if excessive conductive adhesive (solder) is used and partly oozes out, the oozing area is located outside the hollow 40 and below the grounded conductor 44. Therefore, influence of oozy adhesive on the conversion characteristic is limited.

Figure 7:
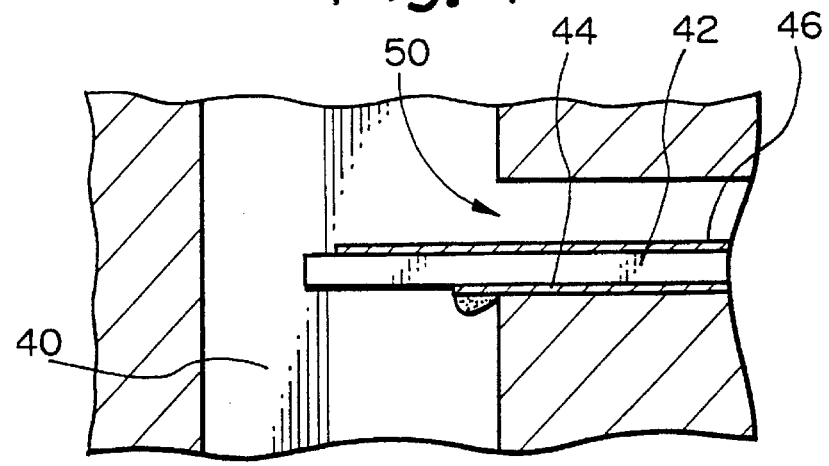
FIG. 7 is a longitudinal sectional view of a waveguide/strip line converter according to another embodiment of the present invention.

FIG. 7 shows another embodiment of the present invention. In this embodiment, the grounded conductor 44 is installed so as to partly project into the hollow 40. The shape of, for example, the strip lines 46 is designed to provide an optimal conversion characteristic for the above structure. Even if excessive conductive adhesive (solder) oozes out to the hollow 40, since the oozing area is located below the grounded conductor 44, influence on the conversion characteristic is limited.

Figure 8A:
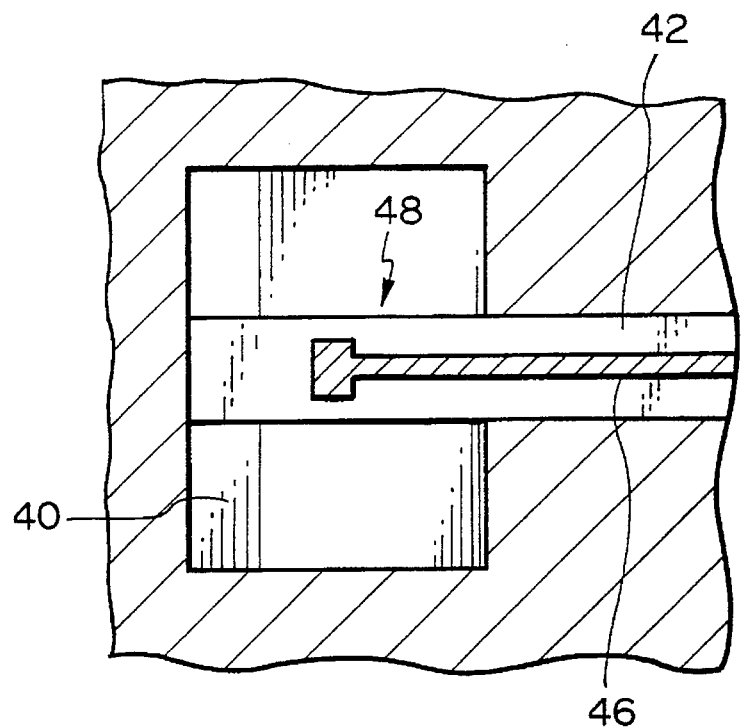
FIG. 8A is a transverse sectional view of a waveguide/strip line converter according to another embodiment of the present invention.
Figure 8B:
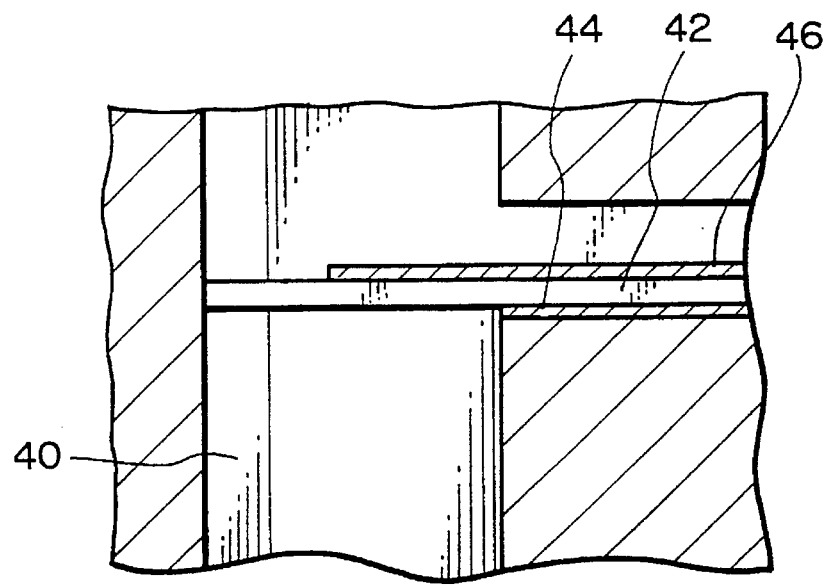
FIG. 8B is a longitudinal sectional view of the waveguide/strip line converter of FIG. 8A.

FIGS. 8A and 8B show another embodiment of the present invention, which correspond to FIGS. 4A and 4B. In this embodiment, for precise alignment of the line conductor 46, the dielectric board 42 is long enough to abut on the wall of the waveguide. Precise alignment is achieved by abutting the end of the dielectric board 42 on the wall.

Figure 9A:
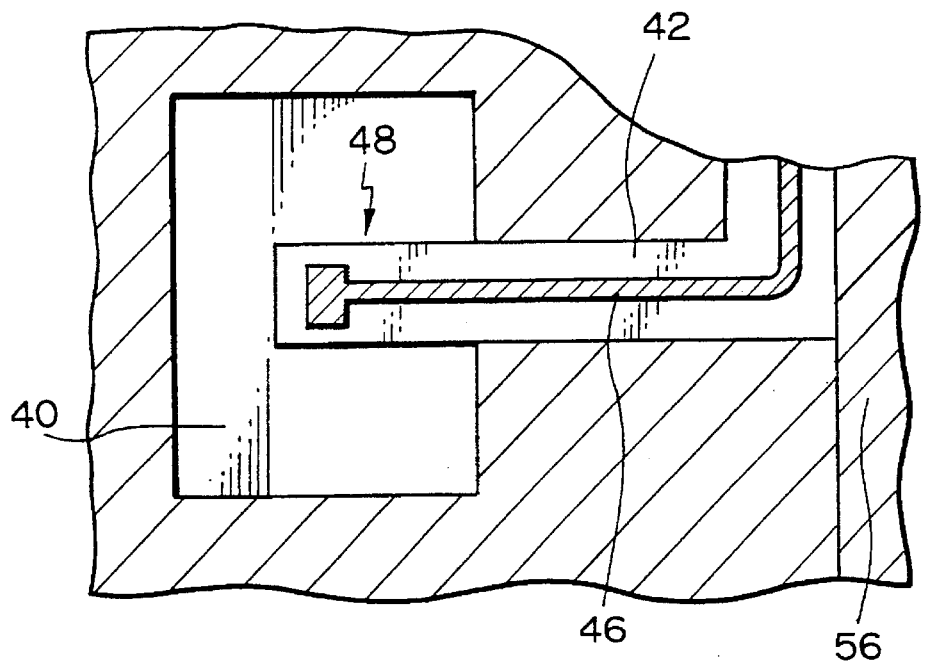
FIG. 9A is a transverse sectional view of a waveguide/strip line converter according to another embodiment of the present invention.
Figure 9B:
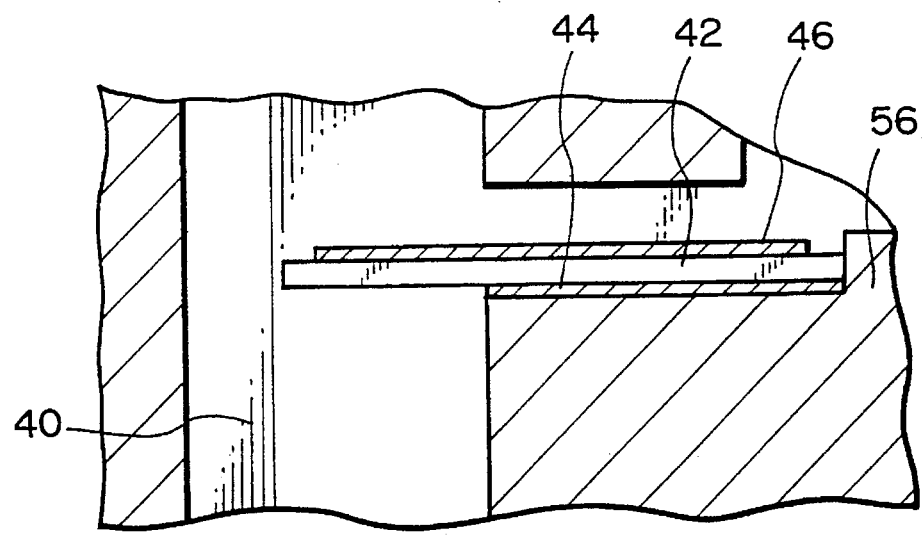
FIG. 9B is a longitudinal sectional view of the waveguide/strip line converter of FIG. 9A.

FIGS. 9A and 9B show another embodiment of the present invention. In this embodiment, the other end of the dielectric board 42 is abutted on a stopper 56 for alignment.

Figure 10A:
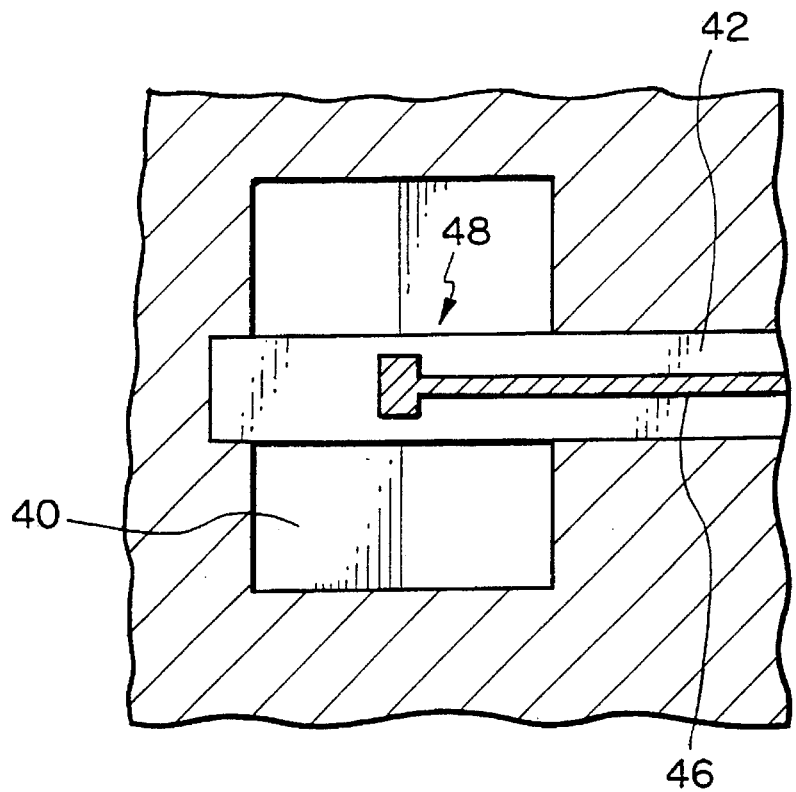
FIG. 10A is a transverse sectional view of a waveguide/strip line converter according to another embodiment of the present invention.
Figure 10B:
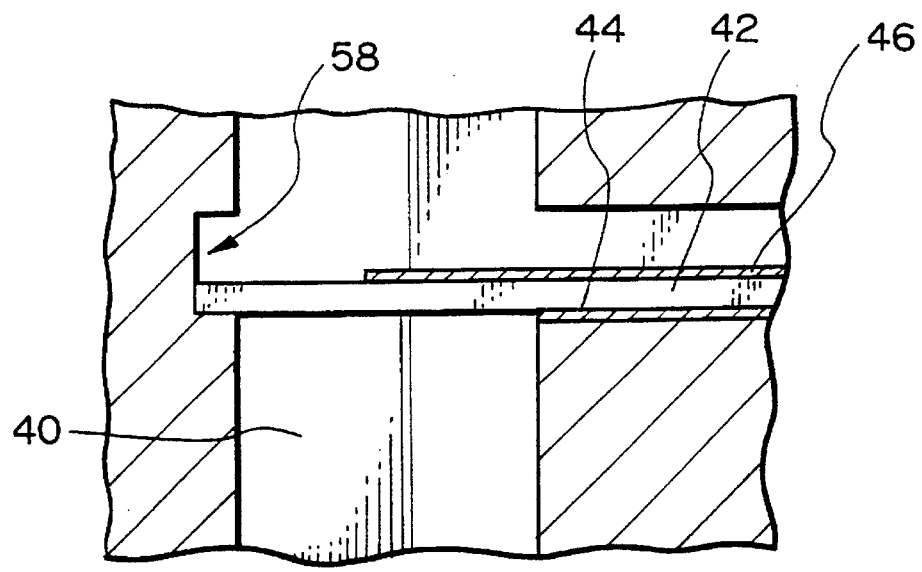
FIG. 10B is a longitudinal sectional view of the waveguide/strip line converter of FIG. 10A.
Figure 11A:
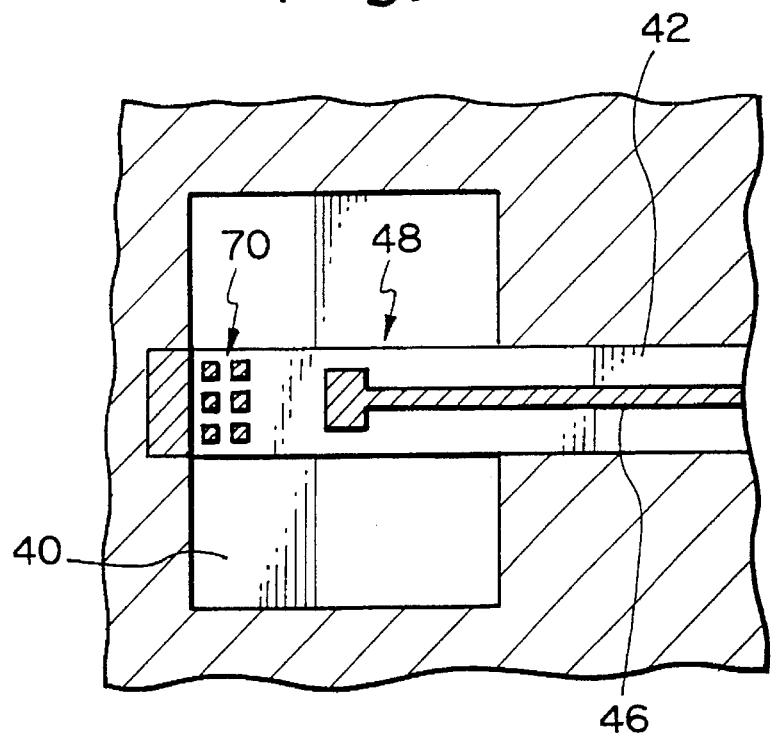
FIG. 11A is a transverse sectional view of a waveguide/strip line converter according to another embodiment of the present invention.
Figure 11B:
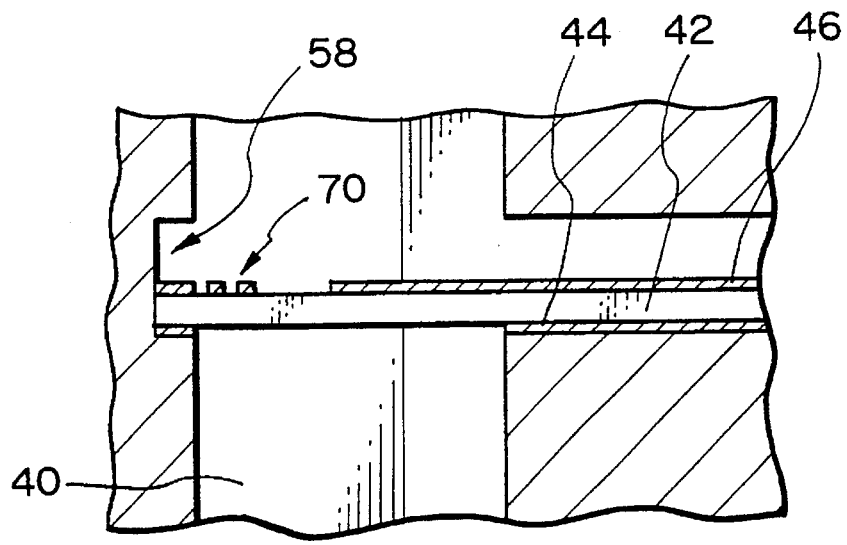
FIG. 11B is a longitudinal sectional view of the waveguide/strip line converter of FIG. 11A.

FIGS. 10A and 10B show another embodiment of the present invention. This embodiment is based on the embodiment described in conjunction with FIGS. 8A and 8B. A recess 58 is formed on the wall of the waveguide, which receives and supports the distal end of the dielectric board 42. The recess 58 also permits alignment of the dielectric board 42. This structure supports the dielectric board 42 in a stable manner. When multiple adjustment patterns 70 are formed as shown in FIGS. 11A and 11B, for example, thermo-compression bonding can be performed for adjustment after assembling; that is, a gold ribbon can be attached to a gap between the adjustment patterns 70.

Figure 12:
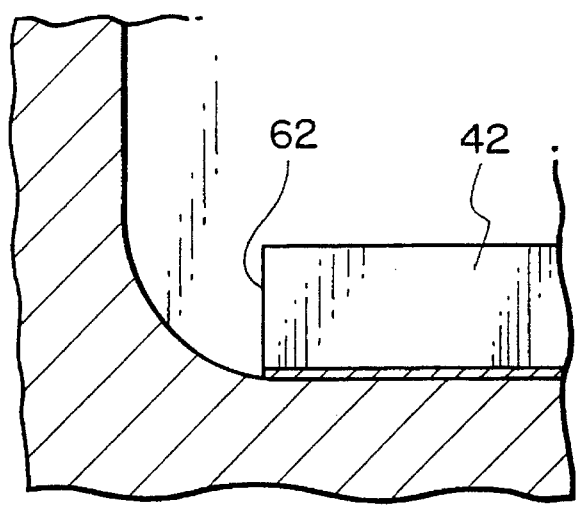
FIGS. 12 and 13 are cross-sectional views explaining a ditch machined in a corner of a stopper in FIGS. 9A and 9B or a recess in FIGS. 10A and 10B.
Figure 13:
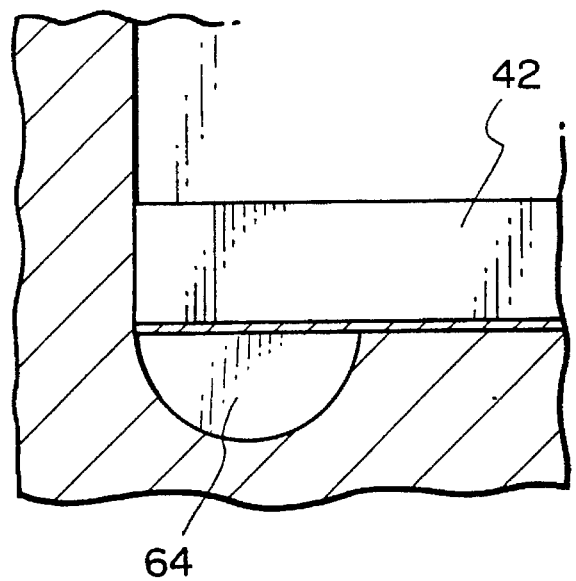

The stopper 56 in FIGS. 9A and 9B, or the recess 58 in FIGS. 10A and 10B must have a corner for receiving the corner of the dielectric board 42. For this purpose, machining is performed. The machining, however, tends to create a round as shown in FIG. 12. This makes it impossible for the end 62 of the dielectric board 42 to abut on the wall perfectly. When a ditch 64 is dug as shown in FIG. 13, the above problem is solved. The ditch 64 also serves as a receptor of conducting adhesive (solder).

Figure 14:
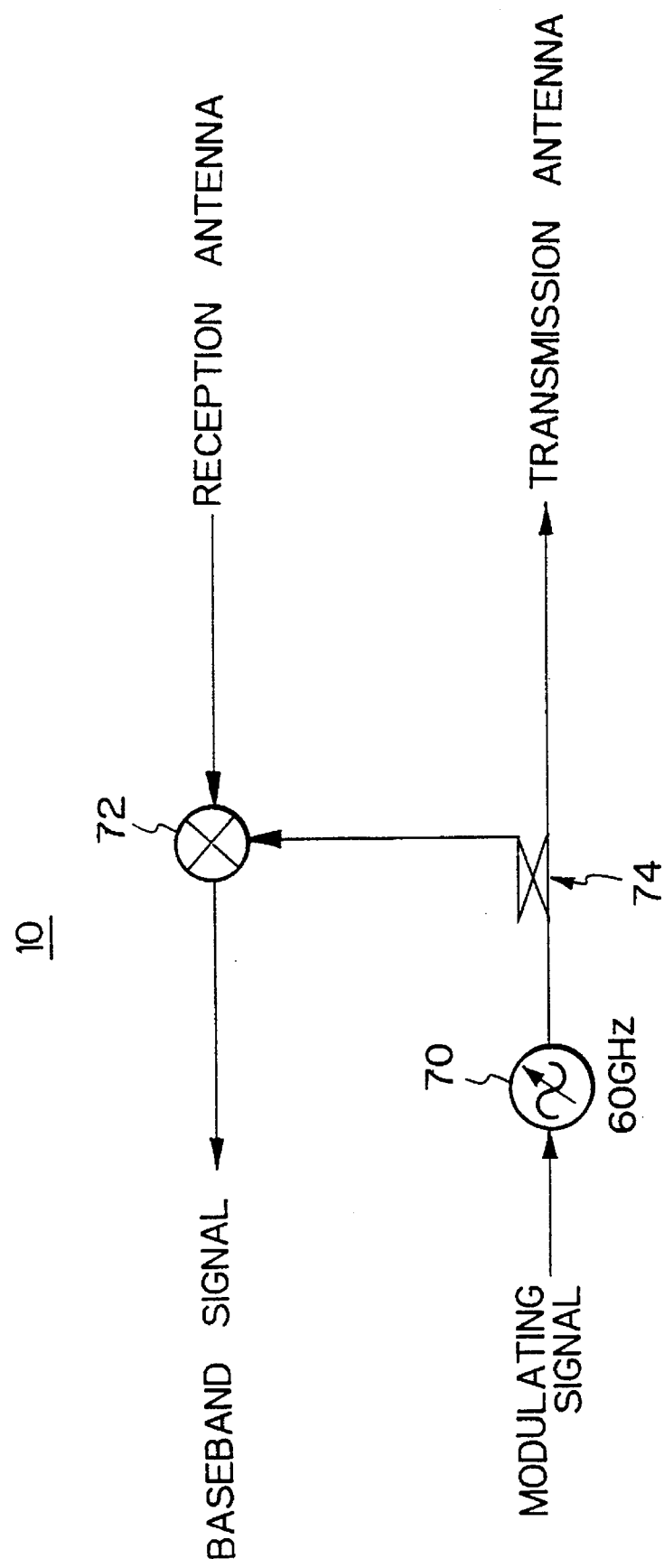
FIG. 14 is a block diagram showing a basic circuitry of a sensor unit for an FM-CW radar.

FIG. 14 shows a basic circuitry of a sensor unit 10 (FIGS. 1A and 1B) for an FM-CW radar.

In FIG. 14, on receipt of a modulating signal, a voltage-controlled oscillator 70 generates a frequency-modulated wave. The frequency-modulated wave is transmitted to an object via a transmission antenna. For an FM-CW radar, a millimeter wave with a frequency of, for example, 60 gigahertz is employed. A triangular wave is used as the modulating signal. A signal reflected from the object and received with a reception antenna is mixed in a mixer 72 with part of a transmission signal that is separated in a directional coupler 74. Then, a baseband signal having a frequency corresponding to a difference in frequency between the transmitted wave and received wave is fetched. Based on the frequency of the baseband signal, a relative distance and a relative speed with respect to the object are calculated.

Figure 15:
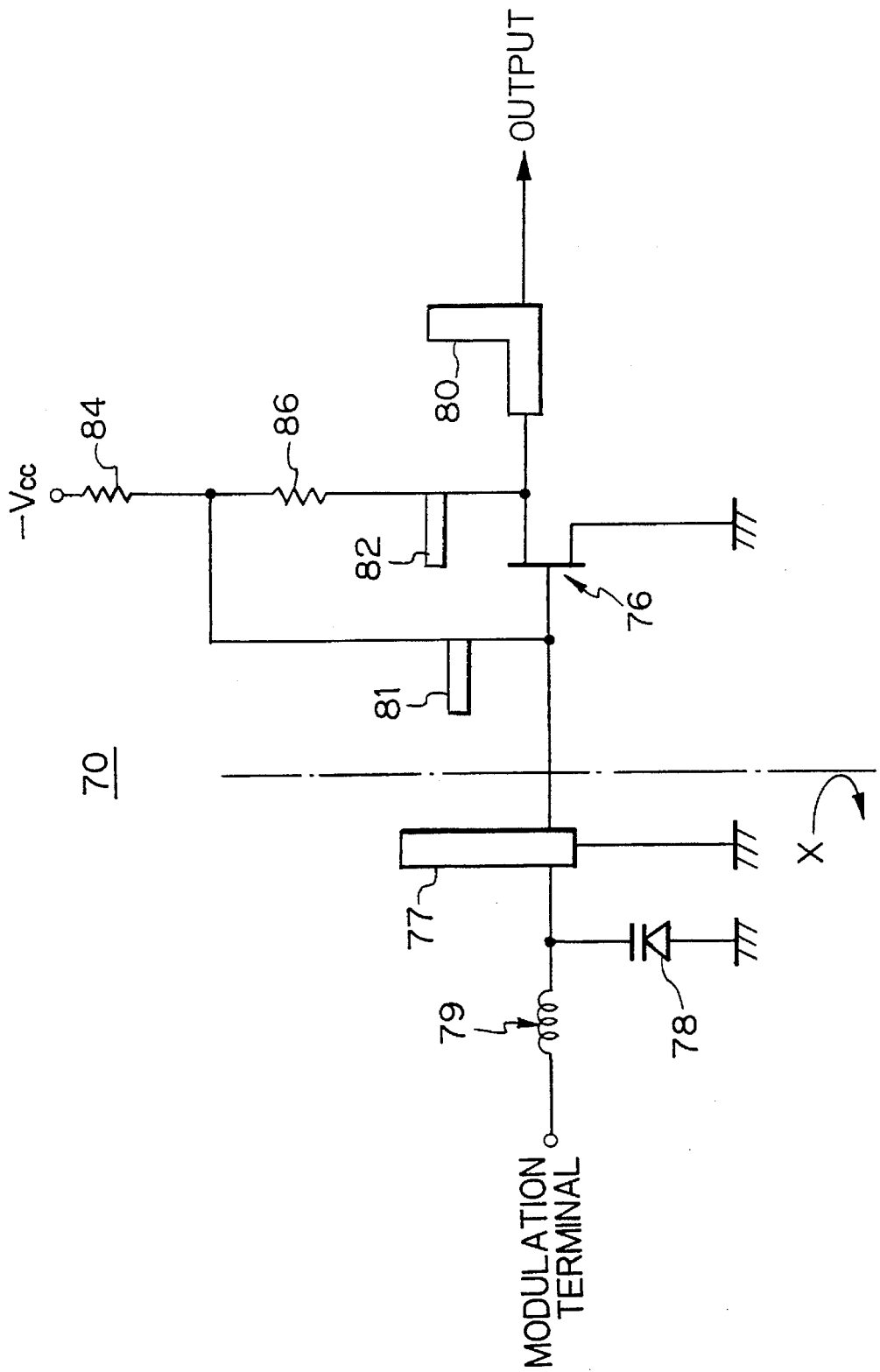
FIG. 15 is a circuit diagram showing an example of a conventional voltage-controlled oscillator.

FIG. 15 is a circuit diagram showing an example of a conventional voltage-controlled oscillator 70 operating in a millimeter wave frequency band. A strip line resonator 77 is connected to a gate of a field-effect transistor (hereafter, FET) 76 that is a gallium arsenide (GaAs) FET or a heterojunction FET. A variable-capacitance diode 78 is connected in parallel with the strip line resonator 77. A modulating signal is applied to the variable-capacitance diode 78 through an inductive element 79 via a modulation terminal. The drain terminal of the FET 76 has a stub 80. The stub 80 controls the size of reflected power indicated with an arrow X at the right of a dot-dash line in FIG. 15. By adjusting the length of the stub 80 and the distance of the stub 80 from the drain terminal of the FET, the reflected power indicated with the arrow X is controlled to become larger than the power loss in the resonator 77 for a 60-gigahertz signal. This allows the resonator 77 to continue stable oscillation at a resonance frequency.

The source terminal of the FET 76 is grounded. A dc bias is supplied from a power supply −Vcc to the gate and drain terminals of the FET 76 via resistors 84 and 86. Stubs 81 and 82 are installed to have a distance μg/4 from the gate and drain terminals of the FET 76 respectively and have a length μg/4 at a frequency of 60 gigahertz. The stubs 81 and 82 serve as band-rejected filters. In other words, since stubs are installed at the above distance and with the above length, when a frequency is 60 gigahertz, seen from the FET 76 side, the gate and drain terminals are seen to be open, the roots of the stubs are seen to be short-circuited, and the tips of the stubs are seen to be open. Thus, the power supply is separated from the oscillation circuit of respect to the signal of 60 gigahertz.

In the voltage-controlled oscillator having the circuitry shown in FIG. 15, when a triangular wave is applied via the modulation terminal on the left of FIG. 15, a frequency-modulated triangular wave signal of 60 gigahertz is generated.

Figure 16:
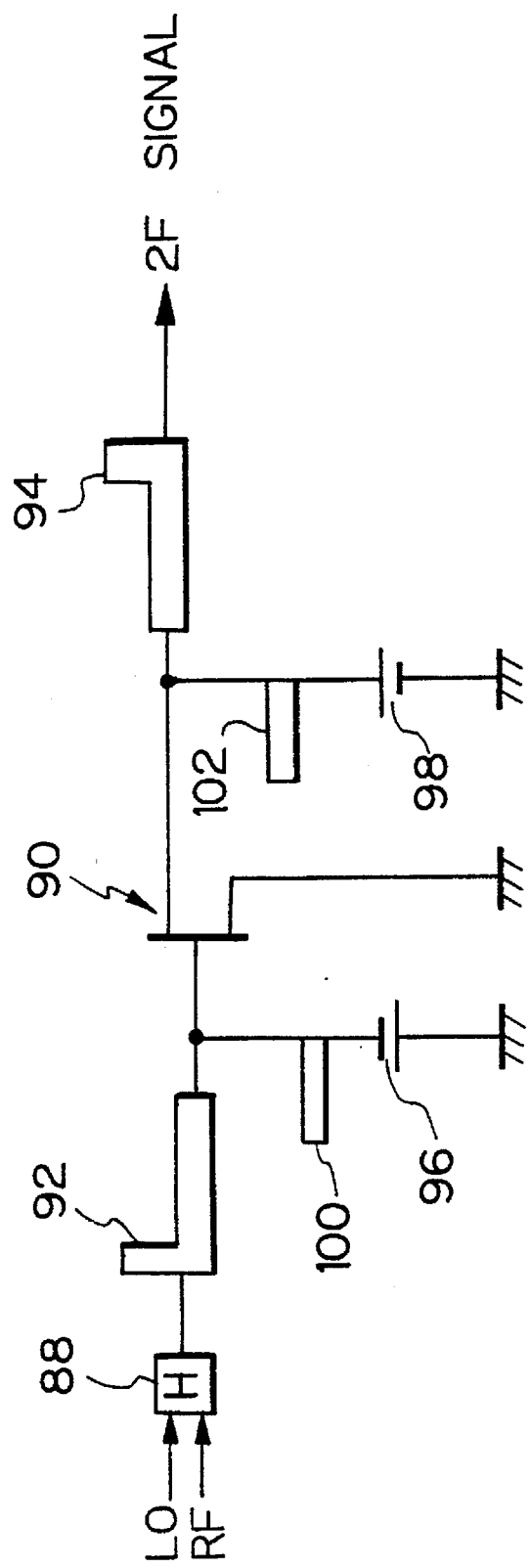
FIG. 16 is a circuit diagram showing an example of a conventional mixer.

FIG. 16 shows an example of a conventional mixer 72 operating in a millimeter wave frequency band. A local oscillator signal LO and a radio-frequency signal (RF) are added in a hybrid 88, and then applied to a gate terminal of a FET 90. A source terminal of the FET 90 is grounded. Due to the non-linear characteristic of an FET, an intermediate-frequency signal whose frequency corresponds to a difference in frequency between two signals develops at the drain terminal. Stubs 92 and 94 of the input and output terminals perform impedance matching on the input and output signals, thus maximizing the power transfer efficiency. Direct-current power supplies 96 and 98 provide the gate and drain terminals with specified negative and positive dc biases. Stubs 100 and 102 are, as described above, provided to separate the power supplies.

Figure 17:
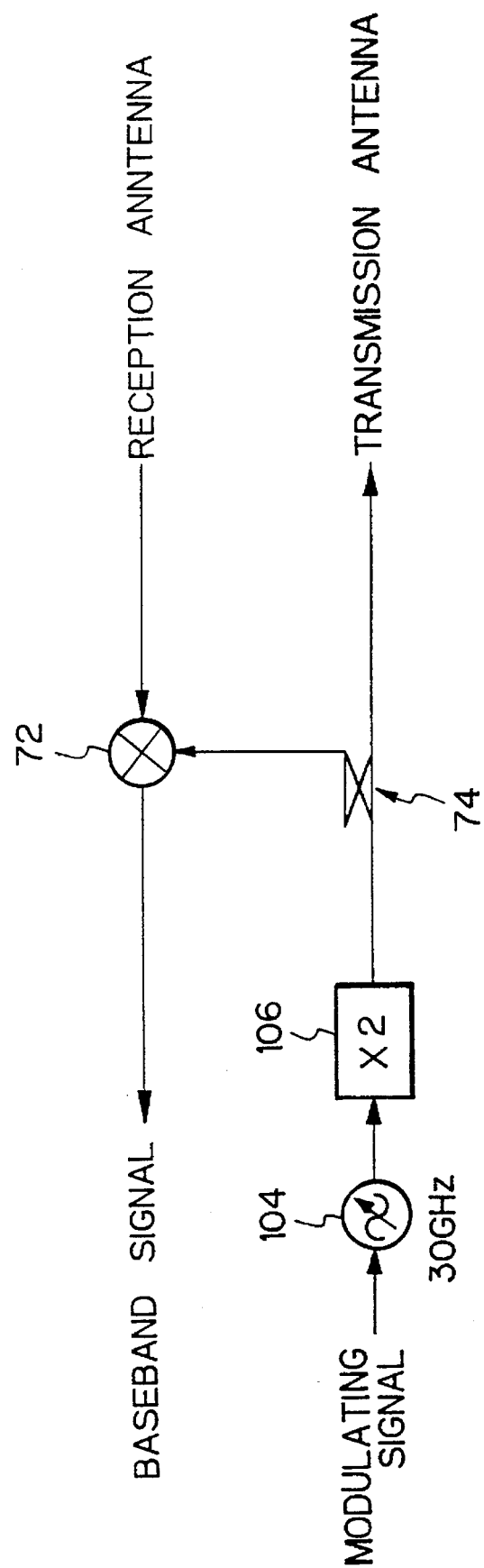
FIG. 17 is a block diagram showing a basic circuitry of a sensor unit using a multiplier.

In general, devices employed for a millimeter wave oscillator are expensive. Alternatively, a frequency-modulated signal whose frequency corresponds to a divisor of the transmission frequency may be generated, and multiplied for use. FIG. 17 show a basic circuitry for materializing this procedure. In FIG. 17, a voltage-controlled oscillator 104 operating at 30 gigahertz generates a frequency-modulated signal, and the frequency-modulated signal is multiplied by a multiplier 106. Thus, a signal with 60 gigahertz is produced.

Figure 18:
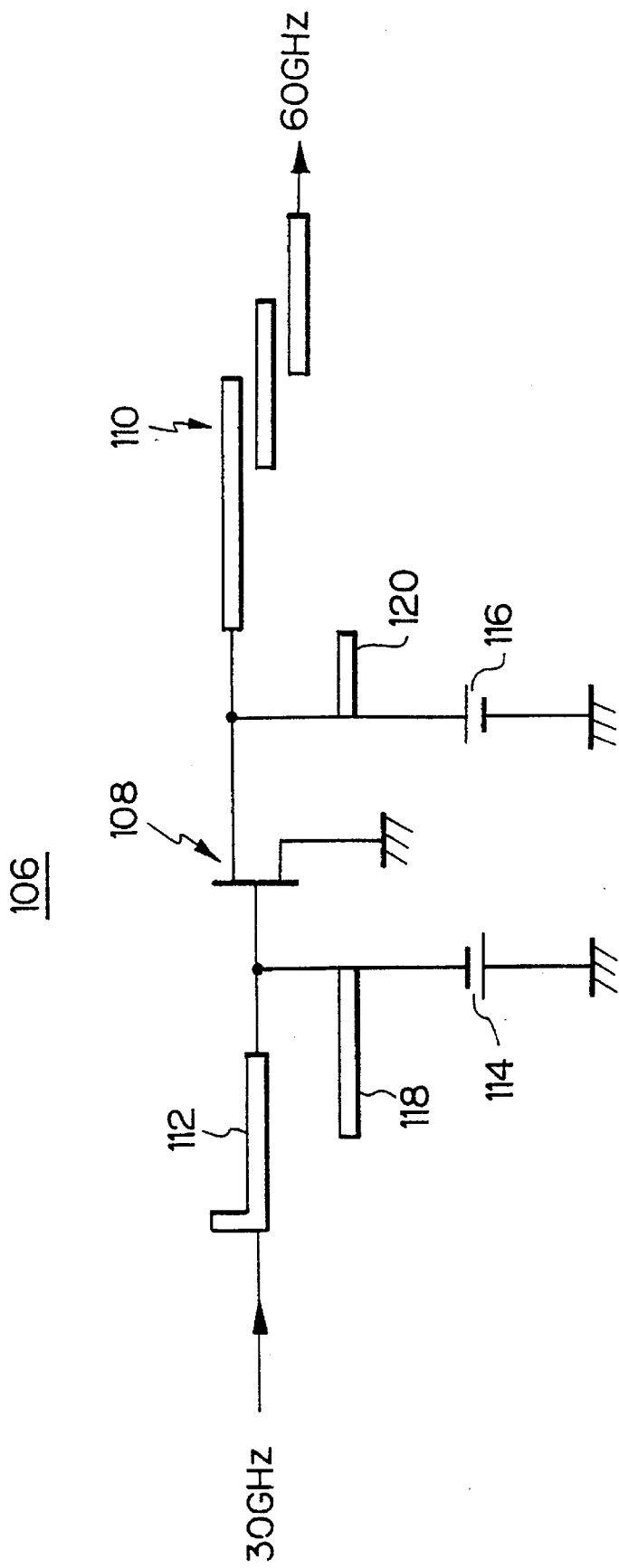
FIG. 18 is a circuit diagram showing an example of a conventional multiplier.

FIG. 18 is a circuit diagram showing an example of a conventional multiplier 106. A 30-gigahertz signal is applied to a gate terminal of an FET 108. A source terminal of the FET 108 is grounded, and in a drain terminal thereof harmonics that are derived from a 30 gigahertz input signal and that include a 60-gigahertz signal are obtained. The harmonics pass through a bandpass filter 110 that is made up of strip lines and is designed to pass 60-gigahertz components, thus producing a 60-gigahertz doubled signal. A stub 112 performs impedance matching on an input signal. The gate and drain terminals of the FET are provided with negative and positive bias voltages from dc power supplies 114 and 116. A stub 118 separates the power supply with respect to 30-gigahertz in an input side, while a stub 120 separates the power supply with respect to 60-gigahertz in an output side.

To realize the sensor unit 10 for an FM-CW radar having the basic configuration shown in FIG. 14, an oscillator circuit having the circuitry shown in FIG. 15 and a mixer having the circuitry shown in FIG. 16 must be employed according to the aforesaid prior art. To realize an FM-CW radar having the basic configuration shown in FIG. 17, an multiplier shown in FIG. 18 and a mixer shown in FIG. 16 must be employed. In either case, a large-scale circuitry made up of expensive millimeter wave devices ensues.

Figure 19:
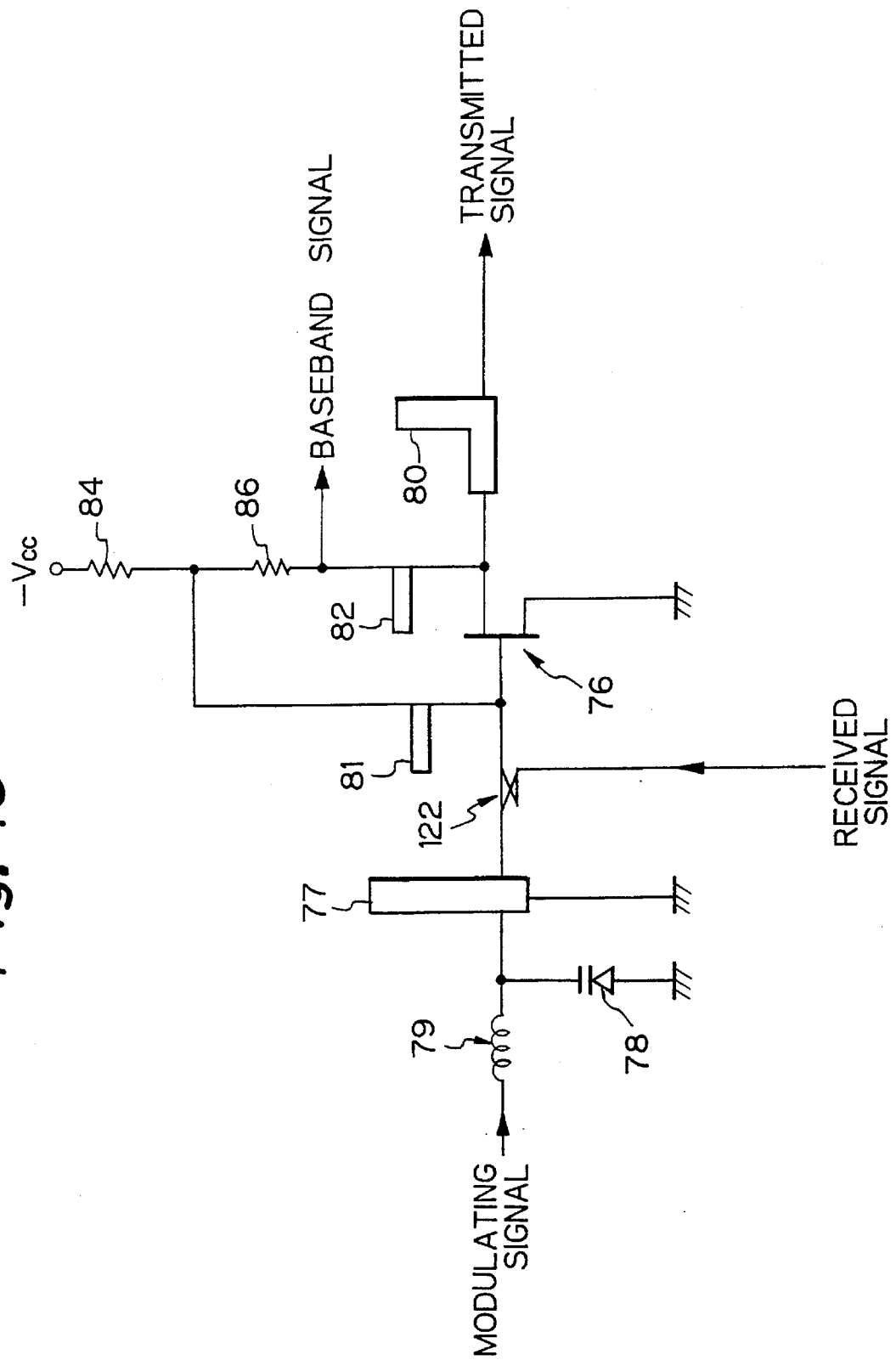
FIG. 19 is a circuit diagram showing an oscillator mixer according to another embodiment of the present invention.

FIG. 19 is a circuit diagram showing an oscillator mixer according to another embodiment of the present invention.

An FET 76 that is a GaAs FET or a heterojunction FET, a resonator 77, a variable-capacitance diode 78, an inductive element 79, stubs 80, 81, and 82, and resistors 84 and 86 constitute a voltage-controlled oscillator described in conjunction with FIG. 15. Specifically, a signal whose frequency is the same as the resonance frequency of the resonator 77 is output as a signal transmitted by the radar. When a modulating signal is applied to one end of the inductive element 79, a frequency-modulated signal is output.

A signal reflected from an object and received with a reception antenna is coupled with the gate terminal of the FET 76 by a directional coupler 122. Due to the non-linear characteristic of the FET 76, a signal whose frequency corresponds to a difference in frequency between the transmitted and received signals develops at a drain terminal (and a gate terminal) of the FET 76. The signal is fetched as a baseband signal via the stub 82 for blocking transmitted and received signals. The resistor 86 has an impedance that is high enough to block a signal having the same frequency as the baseband signal. The baseband signal is, therefore, separated from the power supply by the resistor 86.

Figure 20:
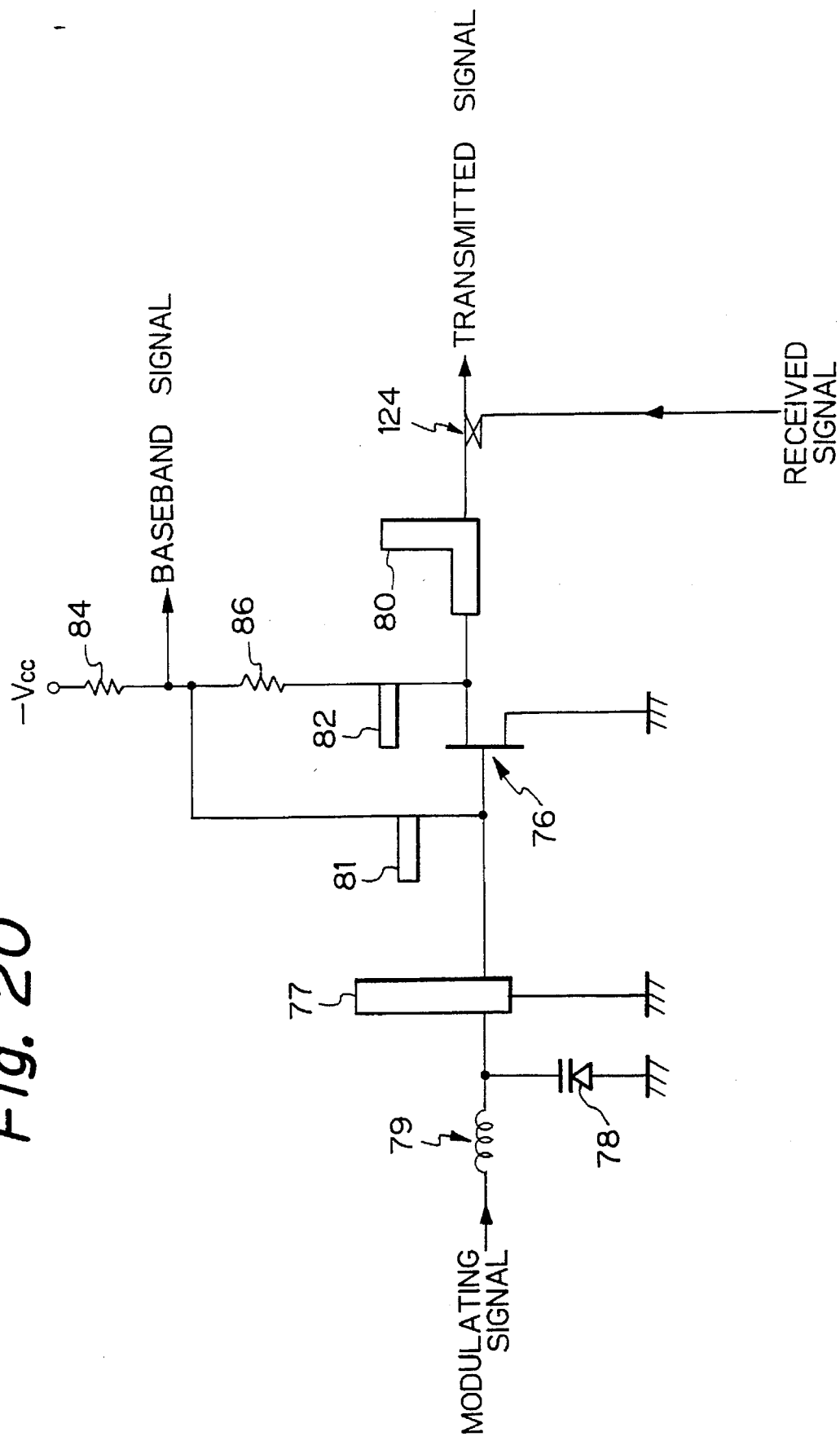
FIG. 20 is a circuit diagram showing another example of the oscillator mixer according to another embodiment of the present invention.

FIG. 20 is a circuit diagram showing another example of an oscillator mixer of the present invention. As shown in FIG. 20, a received signal can be coupled with a drain of the FET 76 via a directional coupler 124. The baseband signal can be fetched at the gate terminal of the FET 76. In this case, the impedance of the resistor 84 separates the baseband signal from the power supply.

Figure 21:
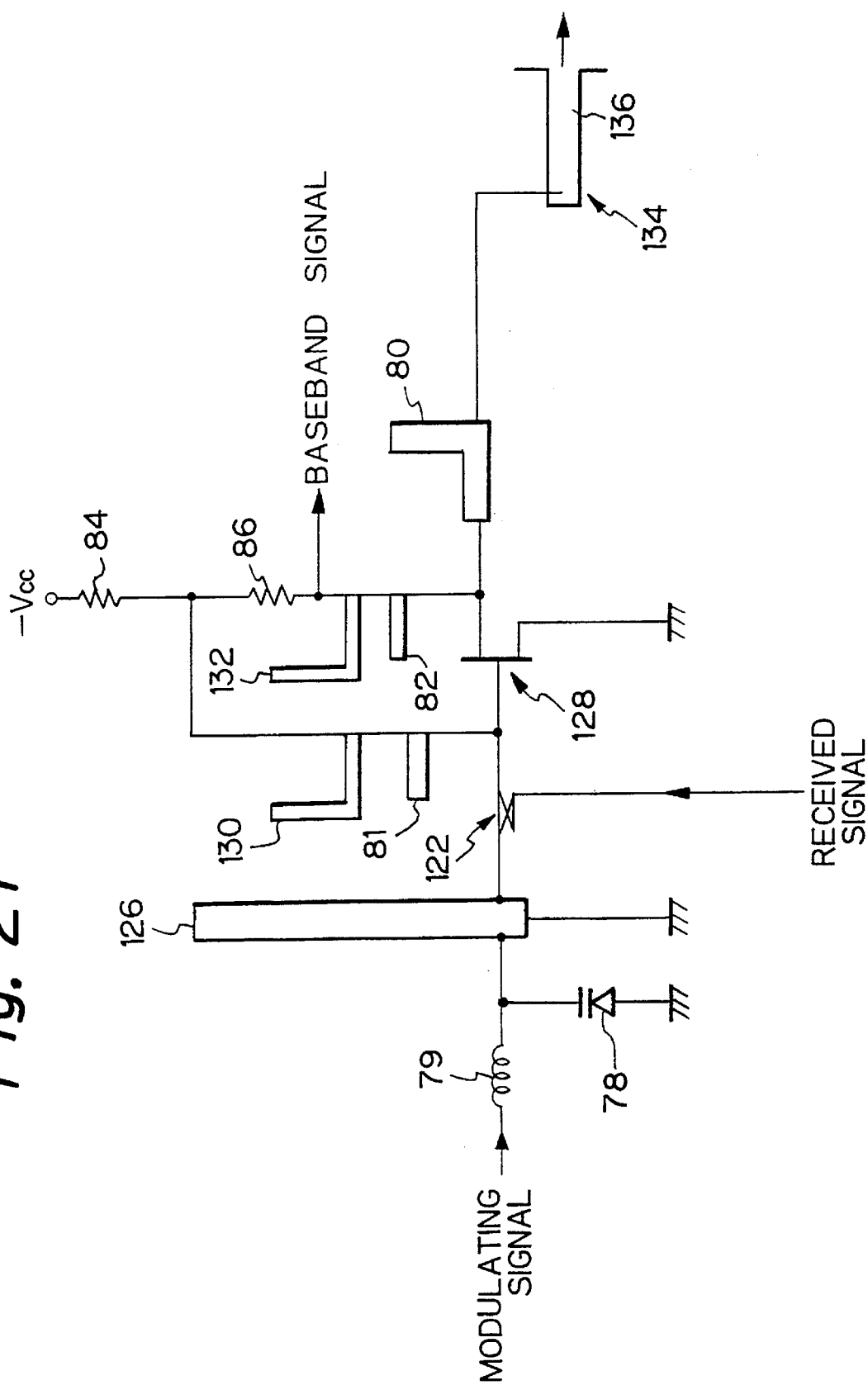
FIG. 21 is a circuit diagram showing another example of the oscillator mixer according to another embodiment of the present invention.

FIG. 21 shows another example of an oscillator mixer of the present invention. In FIG. 21, since an FET capable of directly oscillating a signal in a millimeter wave frequency band or with a frequency of 60 gigahertz is expensive, the signal is oscillated with a frequency that is a divisor of an intended frequency, and then a harmonic is fetched using a highpass filter. Thus, this oscillator mixer shown in FIG. 21 is based on an oscillator multiplication technique.

Assuming that the intended frequency is 60 gigahertz, the resonance frequency of a strip line resonator 126 is half of the intended frequency; that is, 30 gigahertz. An FET 128 forms a 30-gigahertz oscillator. The stubs 81 and 82 function as band-reject filters that do not pass 60-gigahertz. Stubs 130 and 132 function as band-reject filters that do not pass 30 gigahertz. The bends of the stubs 130 and 132 have no significant meanings. The output of the oscillator passes through a waveguide-stripline converter 134 and goes to a 60-gigahertz waveguide 136. That is to say, although the waveguide 136 is originally designed to guide a signal to a transmission antenna, the waveguide 136 also functions as a broadband filter for blocking a 30-gigahertz signal and extracting only a 60-gigahertz signal.

A directional coupler 122 for coupling a received signal may be connected to the gate terminal of the FET 128 as shown in FIG. 21, or to the drain terminal of the FET 128 similarly to those in FIGS. 19 and 20. The baseband signal may be fetched from a port connected to the drain terminal as shown in FIG. 21, or from a port connected to the gate terminal as shown in FIG. 20.

Figure 22:
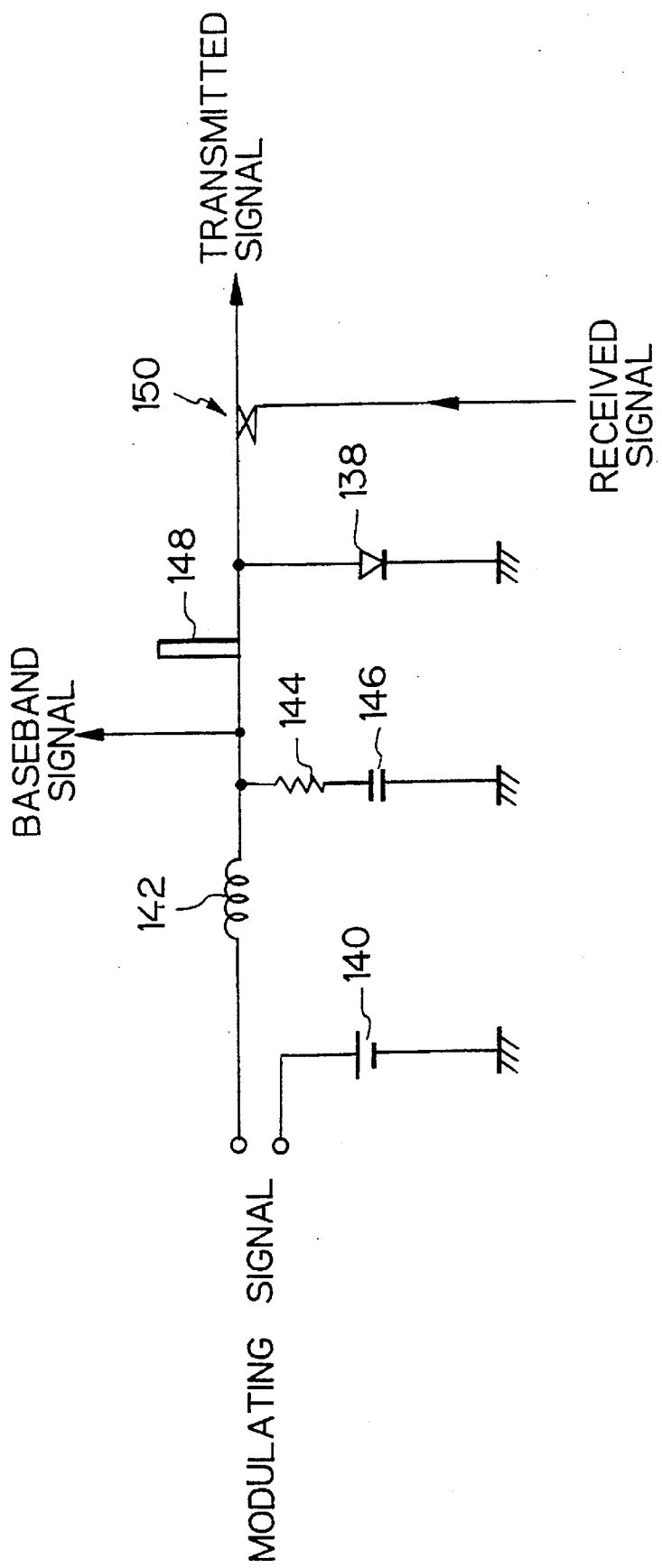
FIG. 22 is a circuit diagram showing another example of the oscillator mixer according to another embodiment of the present invention.

FIG. 22 shows an example using a gunn diode as a non-linear element for use in oscillation and mixing. A bias circuit for supplying bias voltage to a gunn diode 138 is composed of a dc power supply 140, an inductive element 142, a resistor 144, and a capacitor 146. A modulating signal is superimposed on the voltage of the dc power supply 140, thus producing a frequency-modulated signal. A stub 148 is used to separate the gunn diode 138 from the bias circuit at an oscillator frequency.

A received signal is coupled with a transmitted signal by a directional coupler 150. A baseband signal is fetched via a stub 148.

Figure 23:
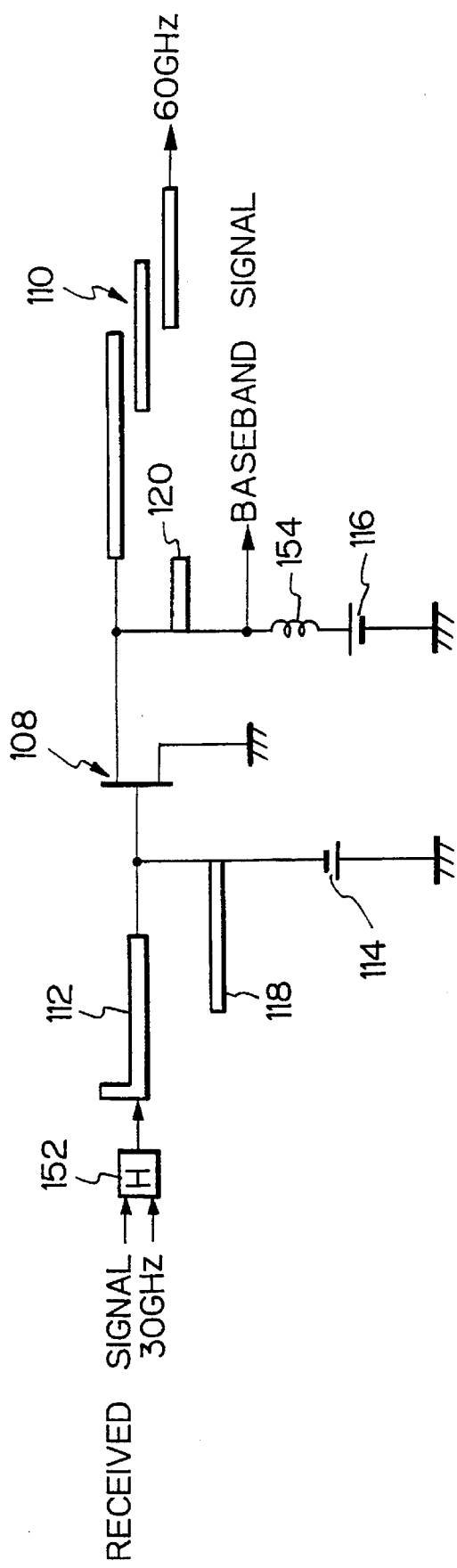
FIG. 23 is a circuit diagram showing an example of a multiplier mixer according to another embodiment of the present invention.

FIG. 23 is a circuit diagram showing an example of a multiplier mixer according to the present invention.

An FET 108, stubs 112, 118 and 120, bias power supplies 114 and 116, and a bandpass filter 110 make up a multiplier described in conjunction with FIG. 18.

A received signal is added to a 30-gigahertz frequency-modulated signal by a hybrid 152, and fed to a gate terminal of the FET 108 after passing through the stub 112.

Due to the non-linear characteristic of the FET 108, a baseband signal developed at the drain terminal is fetched via the stub 120. A choke coil 154 is designed to separate the baseband signal from the power supply 116.

The received signal may be coupled with the gate or drain terminal of the FET 108 using a directional coupler as described in conjunction with FIGS. 19 and 20. As described in FIG. 21, the bandpass filter 110 may not be installed but the waveguide may substitute for the function of the bandpass filter 110.

Figure 24:
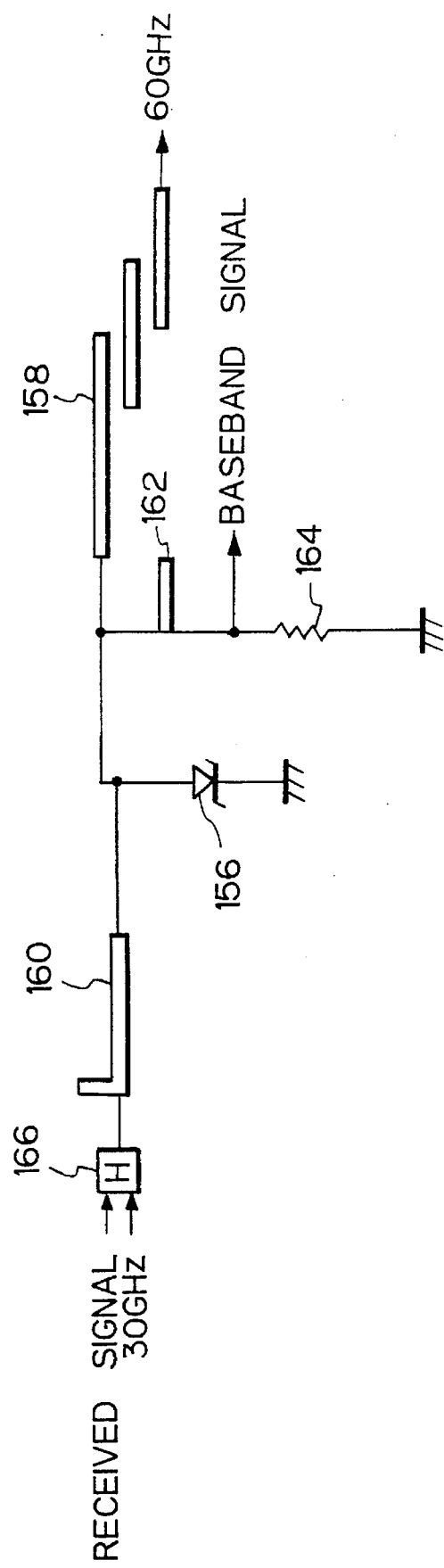
FIG. 24 is a circuit diagram showing another example of the multiplier mixer according to another embodiment of present invention.

FIG. 24 is a circuit diagram showing another example of a multiplier mixer of the present invention. The multiplier mixer is based on a multiplier using the non-linear characteristic of a Schottky diode.

The Schottky diode-based multiplier is composed of a Schottky diode 156, a bandpass filter 158, stubs 160 and 162, and a resistor 164. A received signal is added to a 30-gigahertz frequency-modulated signal by a hybrid 166 and supplied to an anode of the Schottky diode 156. A bias for the Schottky diode is a self-bias occurring across the resistor 164 due to a dc voltage drop in a signal. A baseband signal is fetched from a port between the stub 162 and resistor 164.

Figure 25:
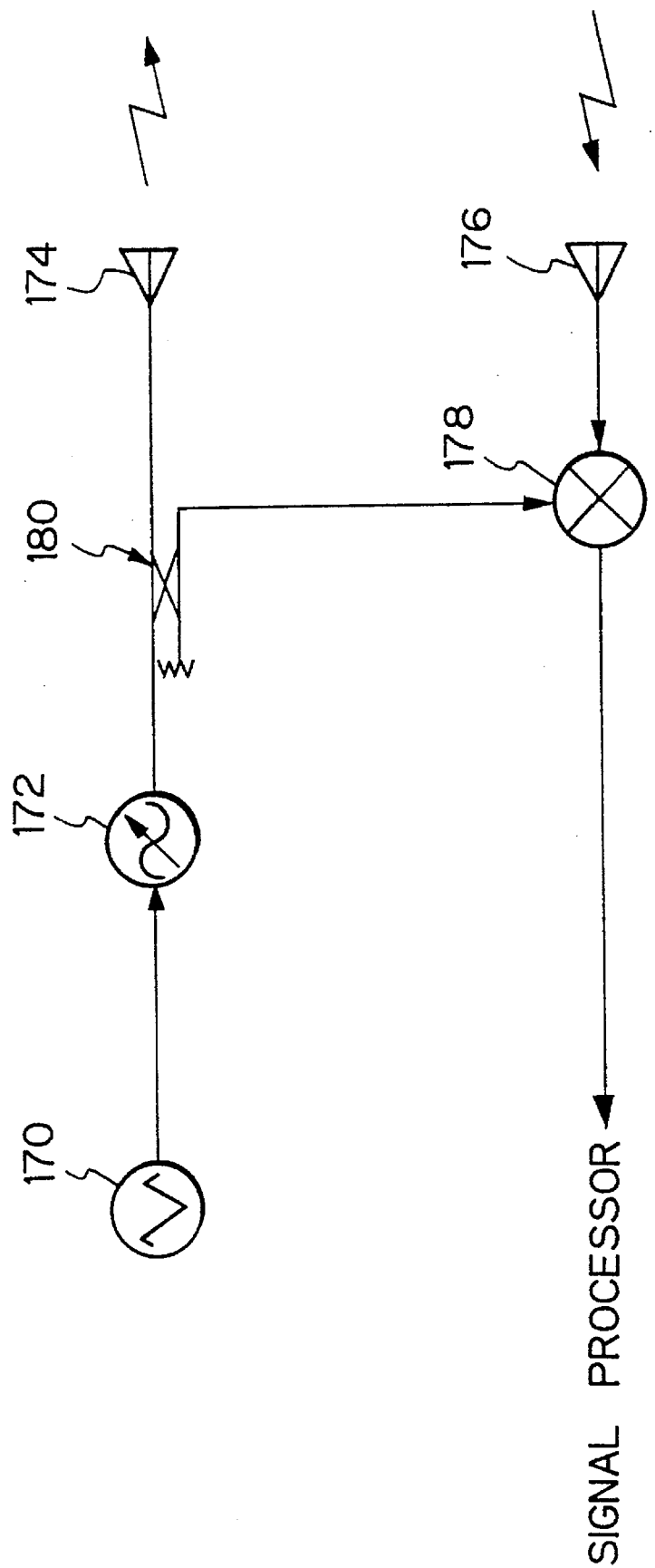
FIG. 25 is a block diagram showing a basic configuration of an FM-CW radar.

FIG. 25 shows a basic configuration of an entire FM-CW radar. A triangular wave generated by a triangular wave generator 170 is fed to a voltage-controlled oscillator 172, and transmitted as a triangular-wave frequency-modulated transmission wave via a transmission antenna 174. An electric wave reflected from an object is received via a reception antenna 176, and mixed in a mixer 178 with part of the transmission wave separated in a directional coupler 180. This results in a beat signal. Spectrum analysis is performed to measure the frequency of the beat signal, whereby a relative distance and a relative speed with respect to an object are calculated simultaneously.

Figure 26:
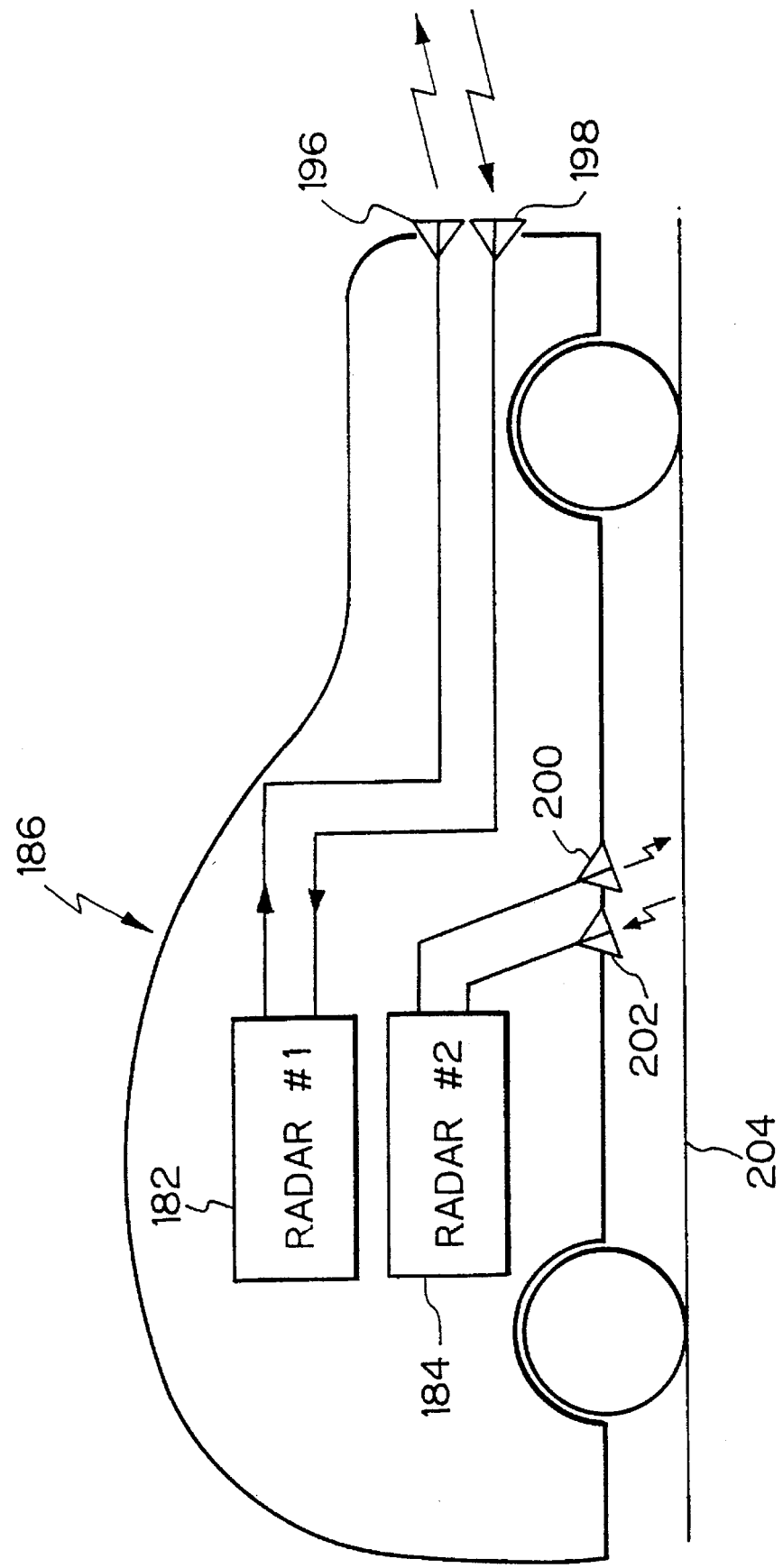
FIG. 26 is a diagram showing two systems of FM-CW radars for detecting absolute speeds of vehicles.

As shown in FIG. 26, two systems of FM-CW radars 182 and 184 each having the aforesaid configuration are installed in a vehicle 186. The FM-CW radar 182 uses a transmission antenna 196 and a reception antenna 198 mounted on the front frame of the vehicle to measure a relative distance and a relative speed with respect to a vehicle running ahead. The FM-CW radar 184 uses a transmission antenna 200 facing the oblique forward ground and a reception antenna 202 placed to receive part of electric waves irregularly reflected from the ground 204, which perform almost the same procedure as the FM-CW radar 182 in order to measure the speed of an own vehicle. If the speed of an own vehicle can be measured, the absolute speed of the vehicle running ahead can also be calculated and displayed. If these data are analyzed in conjunction with a measured value of a rotating speed of a wheel, a slip occurring on the tire of the wheel can be detected and the degree of the slip can be measured. Thus, the range of use of the FM-CW radar expands.

Figure 27:
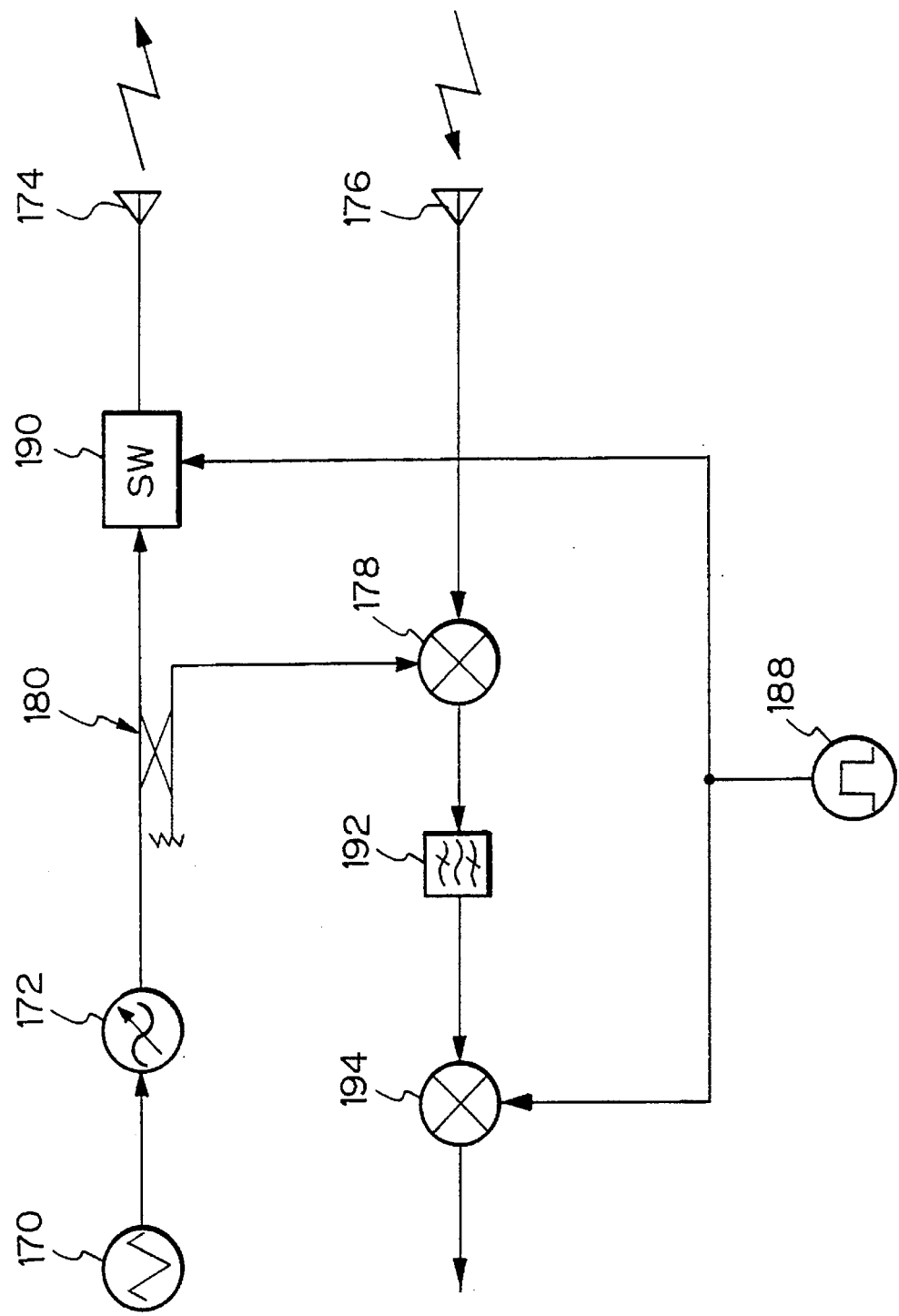
FIG. 27 is a block diagram showing a configuration of a conventional switching radar.

FIG. 27 shows a configuration of a conventional switching radar. In FIG. 27, a rectangular wave generator 188 generates a rectangular wave whose frequency is sufficiently lower than that of a carrier and is at least twice as large as a frequency corresponding to a difference or sum between beat frequencies generated by the mixer 178 in FIG. 25. A switch 190 is driven with the rectangular wave and amplitude-modulates the frequency-modulated wave with an on/off signal. A bandpass filter 192 is characteristic of passing only those components having the same frequency as the rectangular wave. The passed signal is mixed with a rectangular wave signal by the mixer 194. This configuration efficiently eliminates an FM-AM conversion noise occurring in the voltage-controlled oscillator 172 and provides a signal with a high signal-to-noise ratio.

However, the configuration shown in FIG. 26 requires two systems of electric circuits in order to enable measurement of the speed of a vehicle to which the radar is attached and contradicts a demand for downsizing and price cutting. The switching radar shown in FIG. 27 does not effectively utilize power when switched off.

Figure 28:
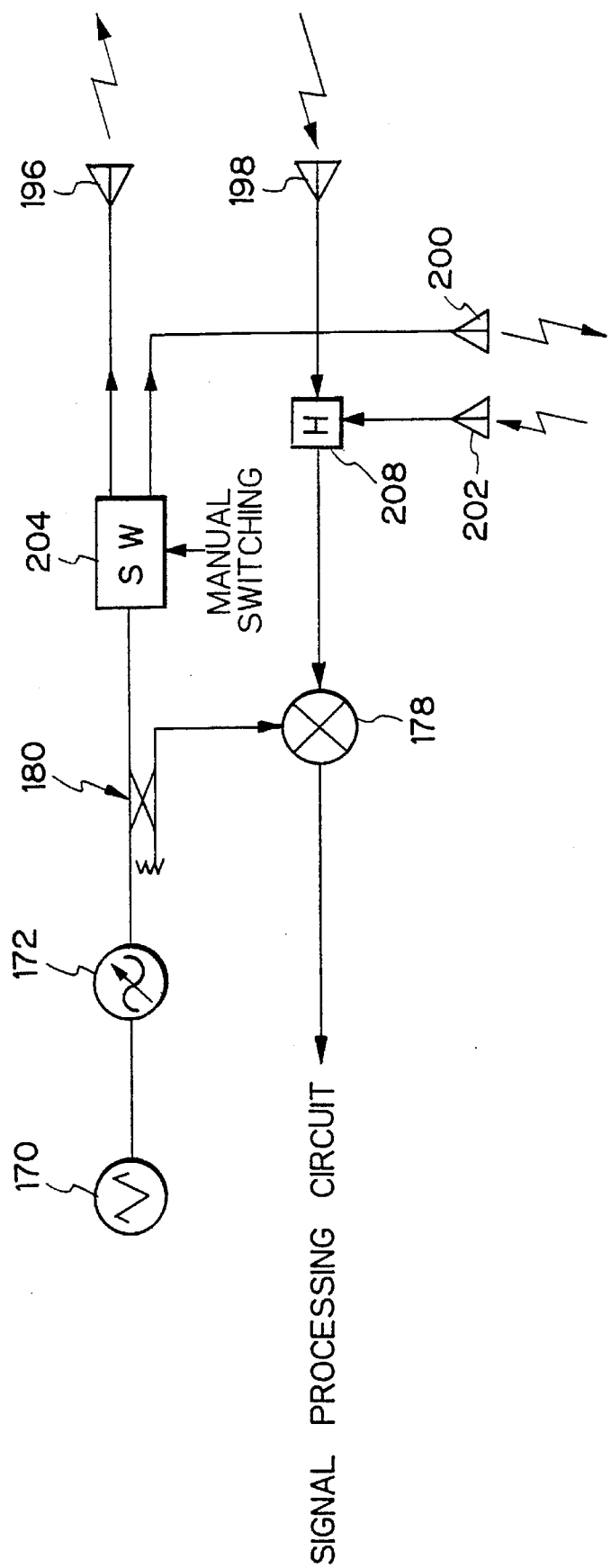
FIG. 28 is a block diagram showing an FM-CW radar system according to another embodiment of the present invention.

FIG. 28 shows another embodiment of the present invention. In FIG. 28 and subsequent FIGS. 29 to 33, components identical to those in FIGS. 25 to 27 will bear the same numerals, and the description will be omitted.

A switch 204 can be manipulated to select either a transmission antenna oriented ahead of a vehicle or a transmission antenna 200 oriented to the oblique forward road surface.

When the switch 204 has selected the transmission antenna 196, a transmission signal sent from a directional coupler 180 is supplied to the antenna 196. Part of an electric wave that has emerged from the antenna 196 and been reflected from a vehicle running ahead is received via a reception antenna 198, and supplied to a mixer 178 via a hybrid 208. The distance and speed calculated by a signal processing circuit at this time are a relative distance and a relative speed with respect to the vehicle running ahead.

When the switch 204 has selected the transmission antenna 200, a transmission signal sent from the directional coupler is supplied to the antenna 200. Part of an electric wave that has emerged from the antenna 200 and been reflected irregularly from the oblique forward road surface is received by a reception antenna 202, and fed to the mixer 178 via the hybrid 208. The speed calculated by the signal processing circuit corresponds to the speed of the vehicle to which the radar is attached. The calculated speed is, however, a speed component in the direction in which an electric wave is transmitted. The speed value must, therefore, be corrected from this viewpoint.

Figure 29:
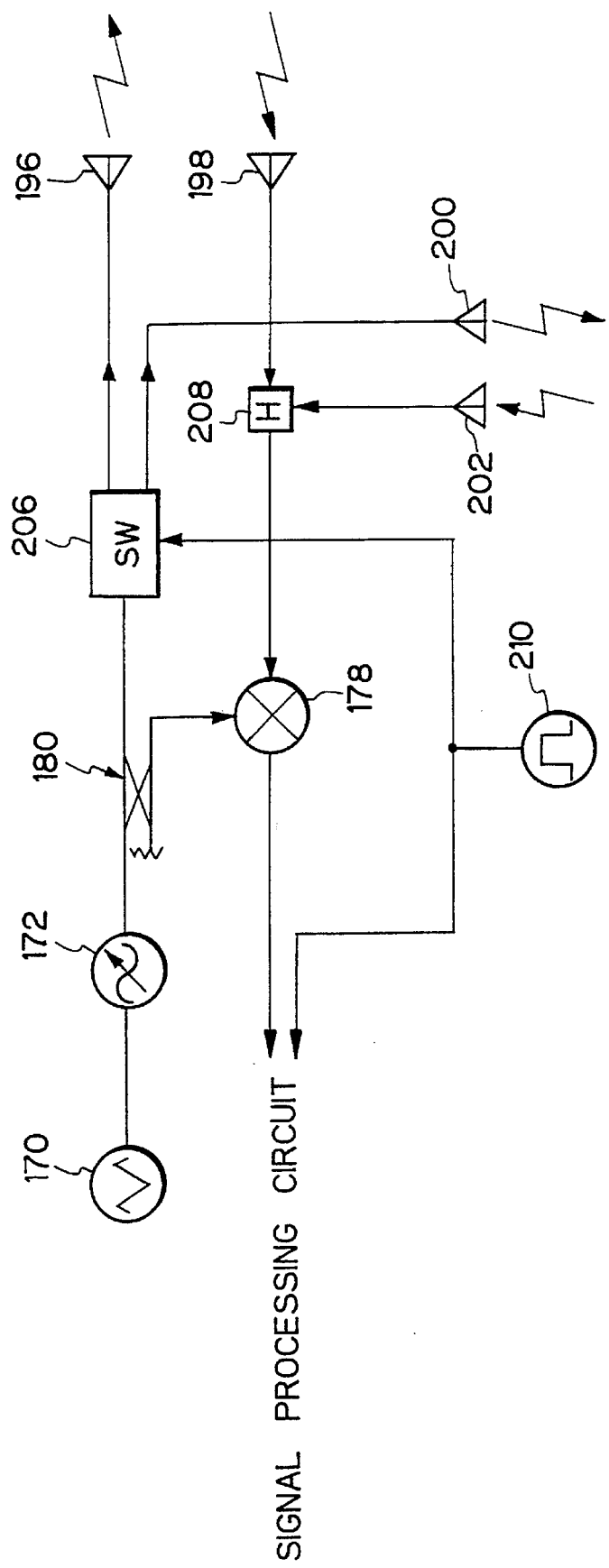
FIG. 29 is a block diagram showing an FM-CW radar system according to another embodiment of the present invention.

FIG. 29 shows another embodiment of the present invention. A switching circuit 206 is driven with a rectangular wave signal supplied by a rectangular wave signal generator 210, and selects an antenna 196 or an antenna 200 according to the level of the rectangular signal. The rectangular wave signal is also supplied to a signal processing circuit. Synchronously with the signal, the signal processing circuit calculates a relative distance and a relative speed with respect to a forward vehicle, and the speed of the vehicle to which the radar is attached.

Figure 30:
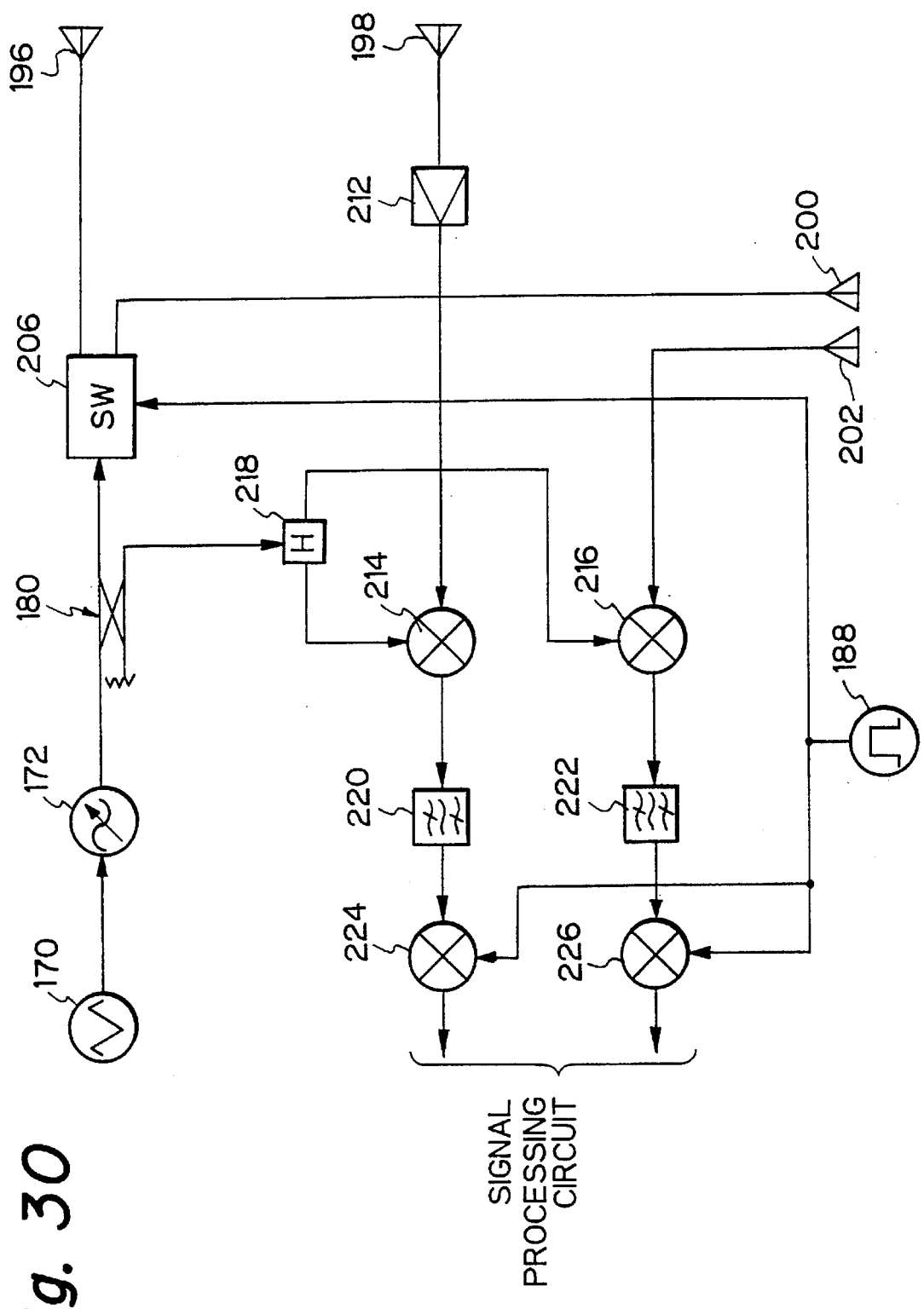
FIG. 30 is a block diagram showing an FM-CW radar system according to another embodiment of the present invention.

FIG. 30 shows another example of the present invention. A rectangular wave signal generator 188 is identical to that used in the switching radar described in conjunction with FIG. 27. A switching circuit 206 is driven with a rectangular wave generated by the rectangular wave signal generator 188. Two signals, each of which corresponds to a signal produced by modulating the amplitude of a frequency-modulated wave with a rectangular wave as used in the switching radar, are obtained in outputs of the switching circuit 206, and they are supplied to antennas 196 and 200.

A signal reflected from a forward vehicle and received with a reception antenna 198 is amplified by a low-noise amplifier 212, and supplied to a mixer 214. On the other hand, a signal reflected from the forward road surface and received with a reception antenna 202 is supplied to a mixer 216. Part of a transmission signal separated by a directional coupler 180 and distributed by a hybrid 218 is supplied to the other input terminals of the mixers 214 and 216. The mixers 214 and 216 function in the same way as the mixer 178 in FIGS. 25 and 27. Bandpass filters 220 and 222 pass, similarly to the bandpass filter 192 in FIG. 27, the components of outputs of the mixers 214 and 216 having the same frequency as the rectangular wave fed by the rectangular wave signal generator 188. Mixers 224 and 226 mix, similarly to the mixer 194 in FIG. 27, the signals passing through the bandpass filters 220 and 222 with the rectangular wave, and send the mixed signals to a signal processing circuit.

As described above, in the embodiment shown in FIG. 30, an output of the voltage-controlled oscillator 172 is used to generate a transmission signal for two systems of switching radars. Even when a rectangular wave signal is turned off, power is utilized effectively. The low-noise amplifier 212 is used to amplify a signal reflected from a forward vehicle. A signal reflected from a road surface and received with the antenna 202 is so intense that a low-noise amplifier need not be installed for this signal.

Figure 31:
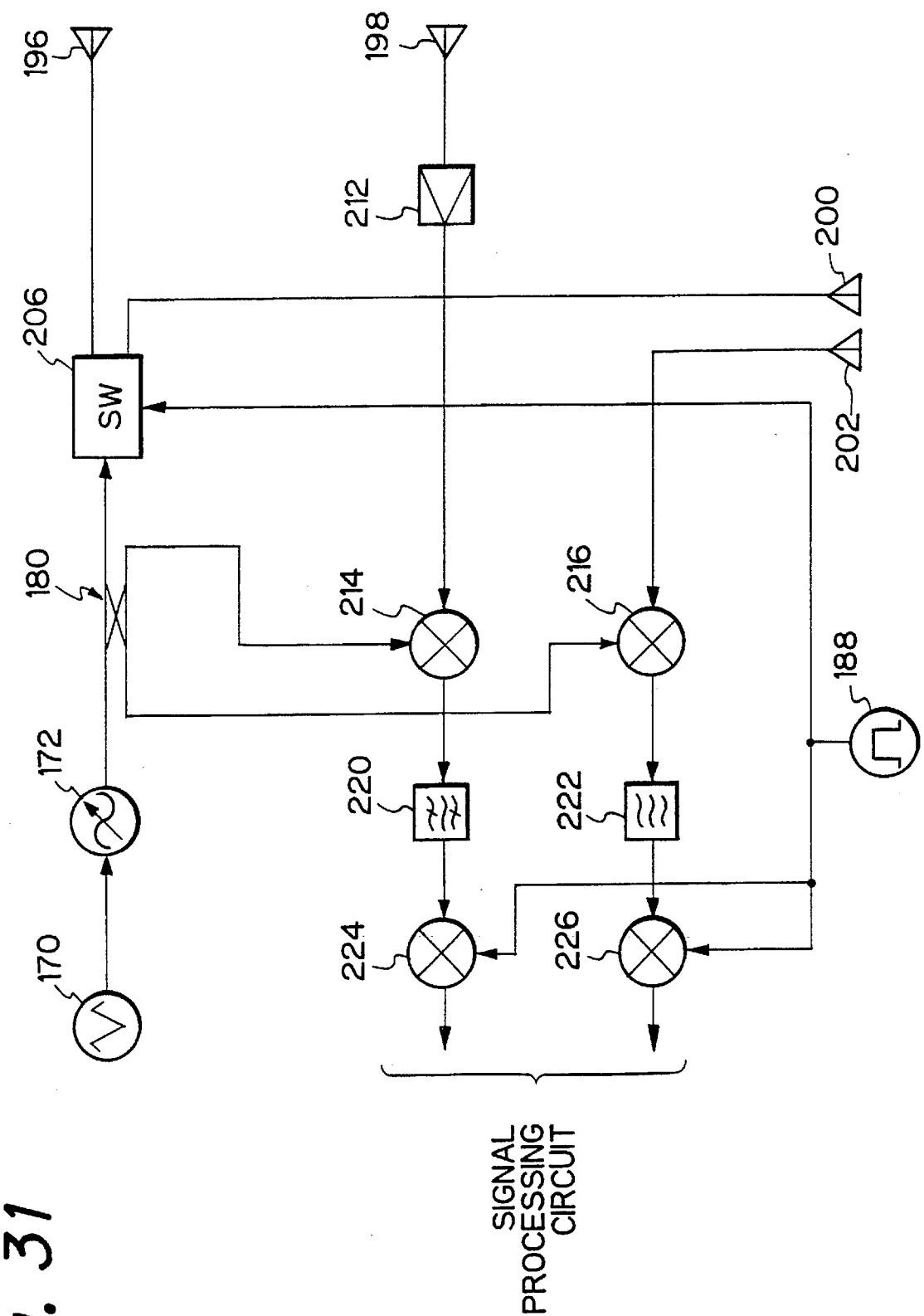
FIG. 31 is a block diagram showing an FM-CW radar system according to another embodiment of the present invention.

FIG. 31 shows another embodiment of the present invention. What differs from the embodiment in FIG. 30 is that the hybrid 58 is not used to distribute part of a transmission signal separated by the directional coupler 180 to two systems. A signal is fetched from a port of a directional coupler, which is connected to a dummy load in FIG. 27, and supplied to a system for measuring the speed of a vehicle to which the radar is attached. Although a quantity of leakage power to this port is small, since a power loss from the transmission antenna 200 to the reception antenna 202 is small, the quantity is sufficient.

Figure 32:
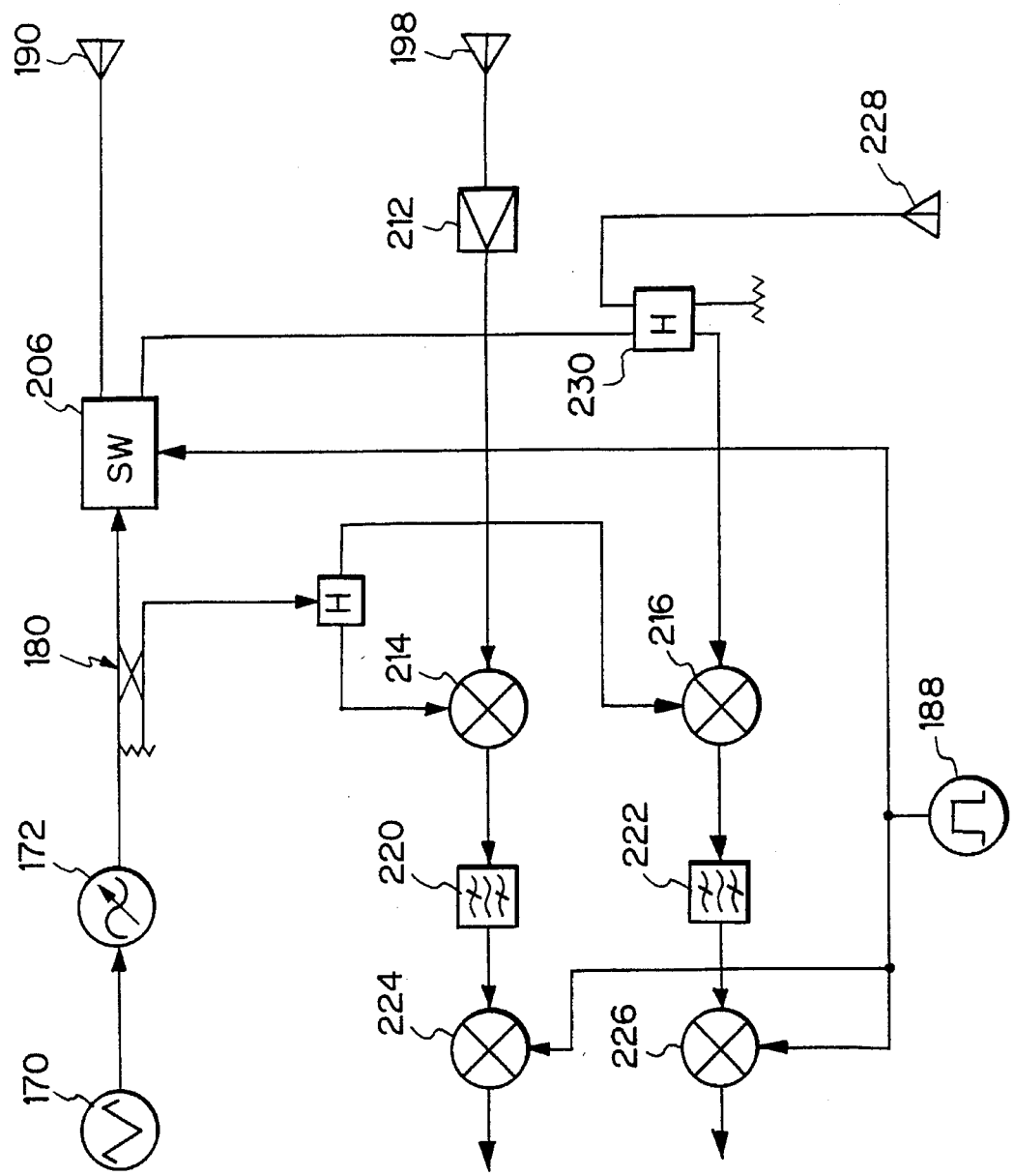
FIG. 32 is a block diagram showing an FM-CW radar system according to another embodiment of the present invention.

FIG. 32 shows another embodiment of the present invention. What differs from the embodiment in FIG. 30 is that two antennas or the transmission and reception antennas 200 and 202 are replaced with a transmission/reception antenna 228. A hybrid 230 is used as a duplexer circuit. An antenna for detecting the speed of a vehicle to which the radar is attached is not required to have such an excellent orientation characteristic or sensitivity as an antenna for detecting a relative distance and a relative speed with respect to another vehicle. That is why the replacement is possible. This idea can apply to the embodiments shown in FIGS. 28, 29 and 31.

Figure 33:
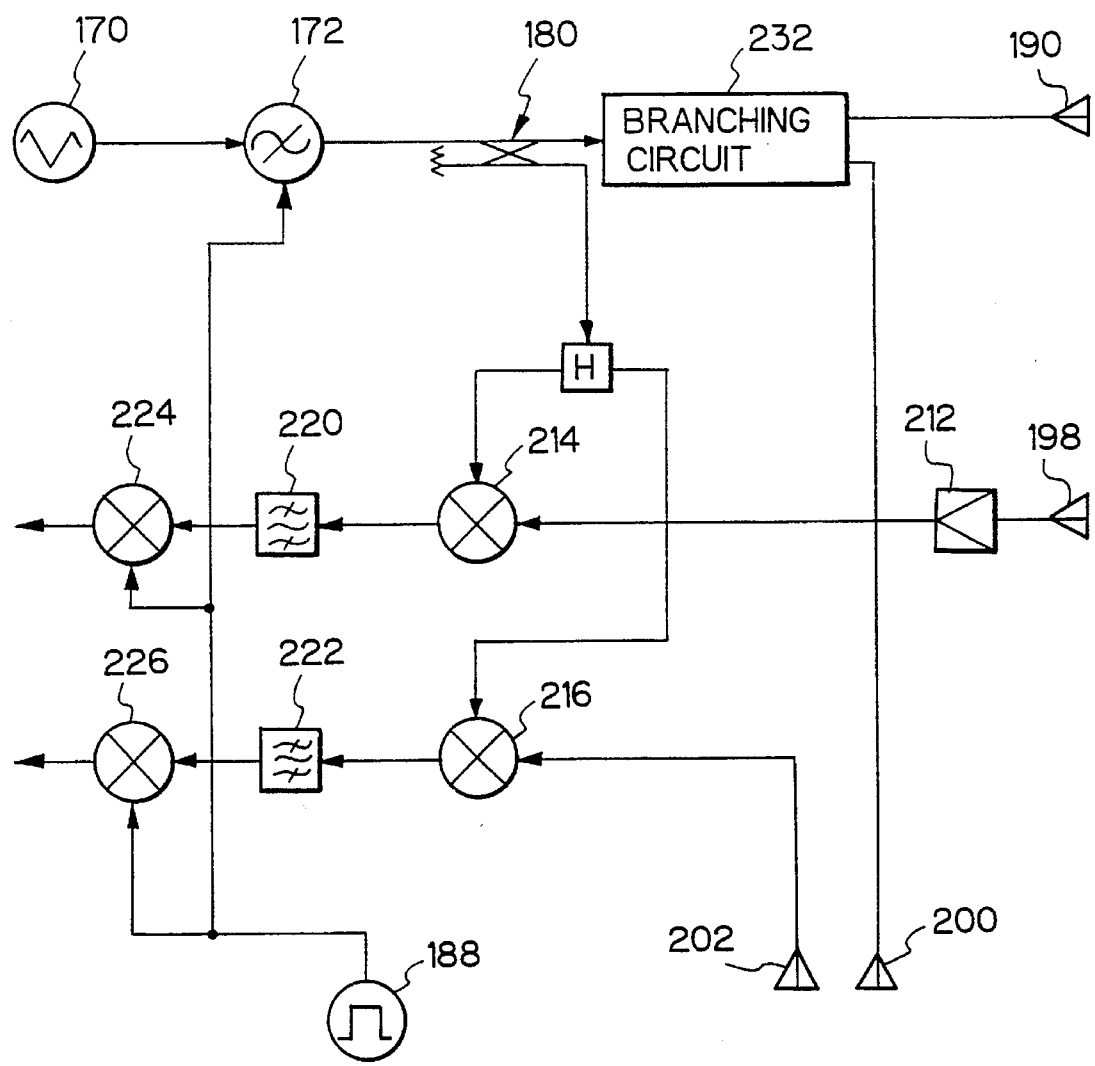
FIG. 33 is a block diagram showing an FM-CW radar system according to another embodiment of the present invention.

FIG. 33 shows another embodiment of the present invention. Instead of switching the switch 206 according to the level of a rectangular signal as is in the circuitry in FIG. 30, the center frequency of the voltage-controlled oscillator 172 is switched according to the level of the rectangular signal, and a branching circuit 232 is used to separate two signals having different center frequencies. This idea can apply to the circuits shown in FIGS. 28, 29, 31 and 32.

We claim:

1. An oscillator mixer for providing an output signal having a specified frequency modulated in accordance with a modulating signal and for outputting a baseband signal having a frequency corresponding to a difference in frequency between an input signal and the output signal, comprising:

a voltage-controlled oscillator including an element having a non-linear characteristic, and providing an output signal having the specified frequency which varies in accordance with the voltage of the modulating signal;

a coupling member inserted into the voltage-controlled oscillator so as to couple the input signal with a line on which the output signal resides, whereby said element generates the baseband signal: and a baseband signal output port connected to the voltage-controlled oscillator via a member for blocking a signal having the specified frequency and through which the baseband signal is fetched.

2. An oscillator mixer according to claim 1, wherein the voltage-controlled oscillator includes a diode serving as the non-linear element.

3. An oscillator mixer according to claim 1, wherein the voltage-controlled oscillator includes a field-effect transistor serving as the non-linear element, a resonator that is connected to a gate terminal of the field-effect transistor and has a resonance frequency that is substantially equal to the specified frequency, and a variable-capacitance element that is connected in parallel with the resonator and whose capacitance varies in accordance with an applied voltage.

4. An oscillator mixer according to claim 1, wherein the voltage-controlled oscillator includes a field-effect transistor serving as the non-linear element, a resonator that is connected to a gate terminal of the field-effect transistor and has a resonance frequency that is substantially equal to a frequency corresponding to a divisor of the specified frequency, and a variable-capacitance element that is connected in parallel with the resonator and whose capacitance varies in accordance with an applied voltage.

5. An oscillator mixer according to claim 3 or 4, wherein the coupling member is connected to a gate terminal of the field-effect transistor.

6. An oscillator mixer according to claim 3 or 4, wherein the coupling member is connected to a drain terminal of the field-effect transistor.

7. An oscillator mixer according to claim 3 or 4, wherein the baseband signal output port is connected to a drain terminal of the field-effect transistor.

8. An oscillator mixer according to claim 3 or 4, wherein the baseband signal output port is connected to a gate terminal of the field-effect transistor.

9. A multiplier mixer for providing an output signal obtained by multiplying a first input signal, and for outputting a baseband signal whose frequency corresponds to a difference in frequency between a second input signal and the output signal comprising:

a multiplier including an element having a non-linear characteristic, inputting the first input signal, and outputting a multiplied signal as the output signal;

a coupling member inserted in the multiplier so as to couple the second input signal with a line on which the output signal resides, whereby said element generates the base band signal; and a baseband signal output port connected to the multiplier via a member for blocking a signal having the same frequency as the output signal and through which the baseband signal is fetched.

10. A multiplier mixer according to claim 9, wherein the multiplier includes a diode serving as the non-linear element.

11. A multiplier mixer according to claim 9, wherein the multiplier includes a field-effect transistor serving as the non-linear element.

12. A multiplier mixer according to claim 11, wherein the coupling member includes a hybrid that adds the first input signal to the second input signal and applies the added signal to a gate terminal of the field-effect transistor.

* * * * *